(12) United States Patent
Wakabayashi et al.

(10) Patent No.: US 6,845,014 B2
(45) Date of Patent: Jan. 18, 2005

(54) CARTRIDGE FOR ELECTRONIC DEVICES

(75) Inventors: Kenichi Wakabayashi, Suwa (JP); Chitoshi Takayama, Suwa (JP); Tadashi Shiozaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/727,400

(22) Filed: Dec. 3, 2003

(65) Prior Publication Data

US 2004/0141294 A1 Jul. 22, 2004

Related U.S. Application Data

(63) Continuation of application No. 10/442,873, filed on May 21, 2003, now Pat. No. 6,771,509, which is a continuation of application No. 10/315,781, filed on Dec. 10, 2002, now Pat. No. 6,608,753, which is a continuation of application No. 10/128,731, filed on Apr. 24, 2002, now Pat. No. 6,515,864, which is a continuation of application No. 09/452,625, filed on Dec. 1, 1999, now Pat. No. 6,404,639, which is a continuation of application No. 08/866,195, filed on May 30, 1997, now Pat. No. 6,025,993, which is a continuation of application No. 08/439,633, filed on May 12, 1995, now Pat. No. 5,659,459, which is a continuation of application No. 08/026,902, filed on Mar. 5, 1993, now abandoned.

(30) Foreign Application Priority Data

May 20, 1992 (JP) .................................. PCT/JP92/00649

(51) Int. Cl.$^7$ ................................................ H05K 7/20
(52) U.S. Cl. ........................ 361/719; 361/704; 361/737; 257/719
(58) Field of Search ................................ 361/687, 690, 361/692, 694, 704–712, 717–719, 726–727; 365/52, 63; 165/80.3, 185; 235/380, 441, 492; 174/35 R, 51

(56) References Cited

U.S. PATENT DOCUMENTS 3,225,262 A 12/1965 Myers
3,993,123 A 11/1976 Chu et al.

(List continued on next page.)

FOREIGN PATENT DOCUMENTS

DE 3237878 4/1984
DE 3416348 11/1985

(List continued on next page.)

OTHER PUBLICATIONS

Hennessy, et al.; "Computer Architect a Quantitative Approach" 1990; pp. 574–585.
IBM T.D.B.; Almquist et al.; Spring–Clip Mounted Extruded Aluminum Heat Sink; May 1981; pp. 5303; vol. 23; No. 12.

(List continued on next page.)

*Primary Examiner*—Michael Datskovsky
(74) *Attorney, Agent, or Firm*—Townsend and Townsend and Crew LLP

(57) ABSTRACT

An add-on cartridge structure for electronic devices having a housing formed from upper and lower case sections. The upper case is typically made from plastic and has a conductive layer formed on inside surfaces, while the lower case is made from a metallic material such as aluminum. A wall-like mating member is disposed on an outer edge of the lower case, and mates with the sides of the upper case to form a nearly rectangular cross section housing. The double conductive layer formed by the outside surface of the mating member and the inside surface of the upper case prevents leakage of electromagnetic radiation from the cartridge. Furthermore, high frequency noise is prevented by grounding both the signal ground of the printed circuit board and the frame ground at multiple locations. The conductive layer has a surface break caused by a through-hole through which the printed circuit board plug protrudes to the outside. Such an opening tends to allow electromagnetic noise to leak outside of the casing, but by grounding the signal and frame grounds at locations near the ends and middle of the plug, harmful noise from electromagnetic radiation is reduced.

26 Claims, 24 Drawing Sheets

U.S. PATENT DOCUMENTS

| | | | |
|---|---|---|---|
| 4,027,206 A | | 5/1977 | Lee |
| 4,029,999 A | * | 6/1977 | Neumann et al. ............ 361/704 |
| 4,092,697 A | | 5/1978 | Spaight |
| 4,137,563 A | | 1/1979 | Tsunoda |
| 4,381,552 A | | 4/1983 | Nocilini et al. |
| 4,545,030 A | | 10/1985 | Kitchin |
| 4,557,225 A | | 12/1985 | Sagues et al. |
| 4,563,725 A | | 1/1986 | Kirby |
| 4,621,304 A | | 11/1986 | Oogaki et al. |
| 4,636,916 A | | 1/1987 | Burt et al. |
| 4,639,829 A | | 1/1987 | Ostergren et al. |
| 4,649,990 A | | 3/1987 | Kurihara et al. |
| 4,682,566 A | | 7/1987 | Aitken |
| 4,729,060 A | | 3/1988 | Yamamoto et al. |
| 4,739,444 A | | 4/1988 | Zushi et al. |
| 4,771,365 A | | 9/1988 | Cichocki et al. |
| 4,791,608 A | | 12/1988 | Fushimoto |
| 4,833,570 A | | 5/1989 | Teratani |
| 4,849,944 A | | 7/1989 | Matsushita |
| 4,855,869 A | | 8/1989 | Tsuji |
| 4,872,091 A | | 10/1989 | Maniwa et al. |
| 4,879,632 A | | 11/1989 | Yamamoto et al. |
| 4,914,551 A | | 4/1990 | Anschel et al. |
| 4,962,444 A | | 10/1990 | Niggemann |
| 5,016,086 A | | 5/1991 | Inoue et al. |
| 5,024,264 A | | 6/1991 | Natori et al. |
| 5,031,076 A | | 7/1991 | Kiku |
| 5,060,112 A | | 10/1991 | Cocconi |
| 5,136,146 A | | 8/1992 | Anglin et al. |
| 5,136,464 A | | 8/1992 | Ohmori |
| 5,138,521 A | | 8/1992 | Watanabe et al. |
| 5,142,614 A | | 8/1992 | Schneider et al. |
| 5,162,610 A | | 11/1992 | Clifton et al. |
| 5,184,211 A | | 2/1993 | Fox |
| 5,195,176 A | | 3/1993 | Lung |
| 5,198,965 A | | 3/1993 | Curtis et al. |
| 5,208,732 A | | 5/1993 | Baudouin et al. |
| 5,227,631 A | | 7/1993 | Hunter, III et al. |
| 5,287,247 A | | 2/1994 | Smits et al. |
| 5,289,342 A | | 2/1994 | Spalding et al. |
| 5,389,819 A | | 2/1995 | Matsuoka |
| 5,424,913 A | | 6/1995 | Swindler |
| 5,432,913 A | | 7/1995 | Smits et al. |
| 5,437,041 A | | 7/1995 | Wakabayashi et al. |
| 5,473,506 A | | 12/1995 | Kikinis |
| 5,475,563 A | | 12/1995 | Donahoe et al. |
| 5,481,656 A | | 1/1996 | Wakabayashi et al. |
| 5,504,669 A | | 4/1996 | Wakabayashi et al. |
| 5,526,229 A | | 6/1996 | Wakabayashi et al. |
| 5,548,487 A | | 8/1996 | Brabetz et al. |
| 5,615,085 A | | 3/1997 | Wakabayashi et al. |

FOREIGN PATENT DOCUMENTS

| | | |
|---|---|---|
| DE | 9112099.3 | 1/1992 |
| EP | 0198378 A2 | 10/1986 |
| FR | 2601791 A1 | 1/1988 |
| GB | 2164803 A | 3/1986 |
| GB | 2248973 A | 4/1992 |
| JP | 53-91375 | 8/1978 |
| JP | 54-2834 | 1/1979 |
| JP | 56-129353 A | 10/1981 |
| JP | 57-75498 A | 5/1982 |
| JP | 57-75499 A | 5/1982 |
| JP | 57-198798 | 12/1982 |
| JP | 58-30994 | 2/1983 |
| JP | 58-140691 | 9/1983 |
| JP | 58-162694 | 10/1983 |
| JP | 58-201349 A | 11/1983 |
| JP | 59-194458 A | 11/1984 |
| JP | 60-32397 A | 2/1985 |
| JP | 60-173791 A | 9/1985 |
| JP | 60-254841 A | 12/1985 |
| JP | 61-222763 A | 10/1986 |
| JP | 62-1181 A | 1/1987 |
| JP | 62-45841 U | 3/1987 |
| JP | 63-50096 A | 3/1988 |
| JP | 63-181385 A | 7/1988 |
| JP | 63-184397 A | 7/1988 |
| JP | 63-187796 U | 11/1988 |
| JP | 63-278261 A | 11/1988 |
| JP | 63-289999 A | 11/1988 |
| JP | 63-292661 A | 11/1988 |
| JP | 64-74797 A | 3/1989 |
| JP | 1-122195 A | 5/1989 |
| JP | 1-165415 A | 6/1989 |
| JP | 1-89791 U | 8/1989 |
| JP | 1-140799 A | 8/1989 |
| JP | 1-200898 A | 9/1989 |
| JP | 1-298753 A | 12/1989 |
| JP | 1-319194 A | 12/1989 |
| JP | 2-58789 A | 2/1990 |
| JP | 2-66962 A | 3/1990 |
| JP | 2-119299 A | 5/1990 |
| JP | 2-123798 U | 10/1990 |
| JP | 2-253289 A | 10/1990 |
| JP | 2-277700 A | 11/1990 |
| JP | 3-6724 A | 1/1991 |
| JP | 3-11409 A | 1/1991 |
| JP | 3-22160 A | 1/1991 |
| JP | 3-36615 A | 2/1991 |
| JP | 3-182397 A | 8/1991 |
| JP | 63-119554 A | 5/1998 |
| JP | 63-284869 A | 11/1998 |

OTHER PUBLICATIONS

Izadian, J., S., et al., "Increasing Circuit Complexities Require Sophisticated Design Considerations in Microwave Packaging", *MSN Microwave Systems News* (May 1985), vol. 15, No. 6, pp. 138, 141, 144, 146.

Sell, G., "Amplifiers and Enclosures: The Heat Dissipation Question", (Sep. 1989), *Communications Engineering and Design*, vol. 15, No. 10, pp. 34, 38, 42, 46.

* cited by examiner

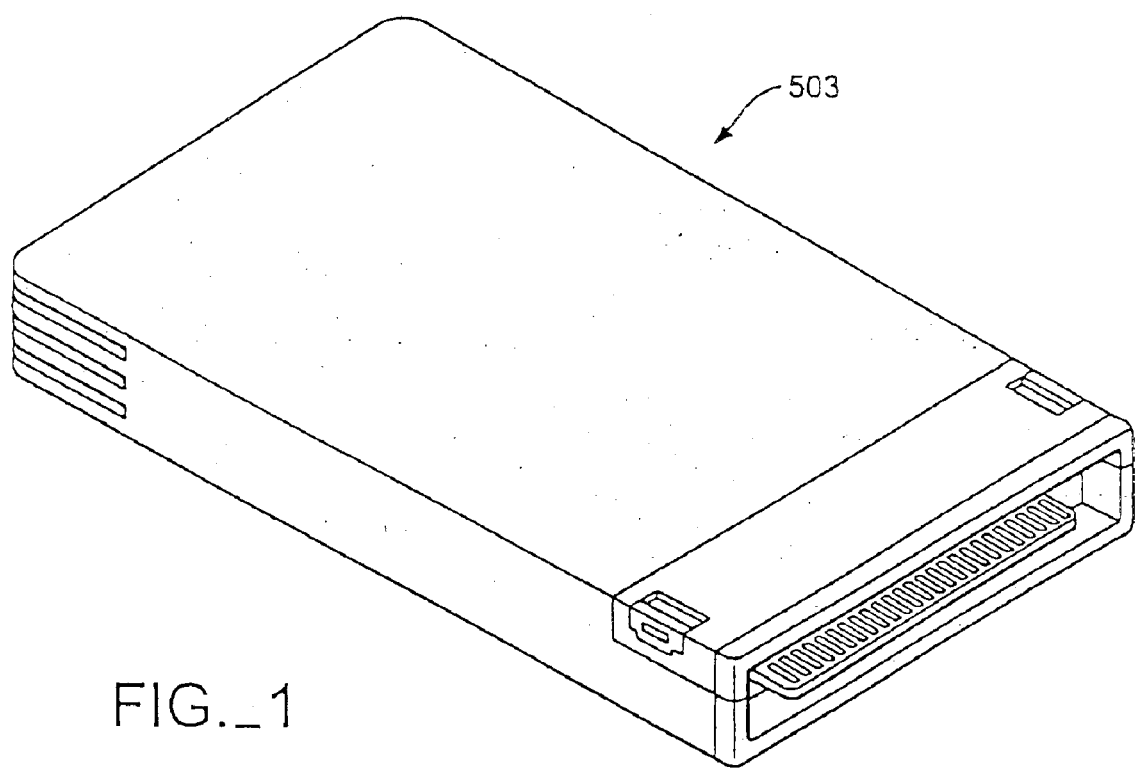
FIG._1
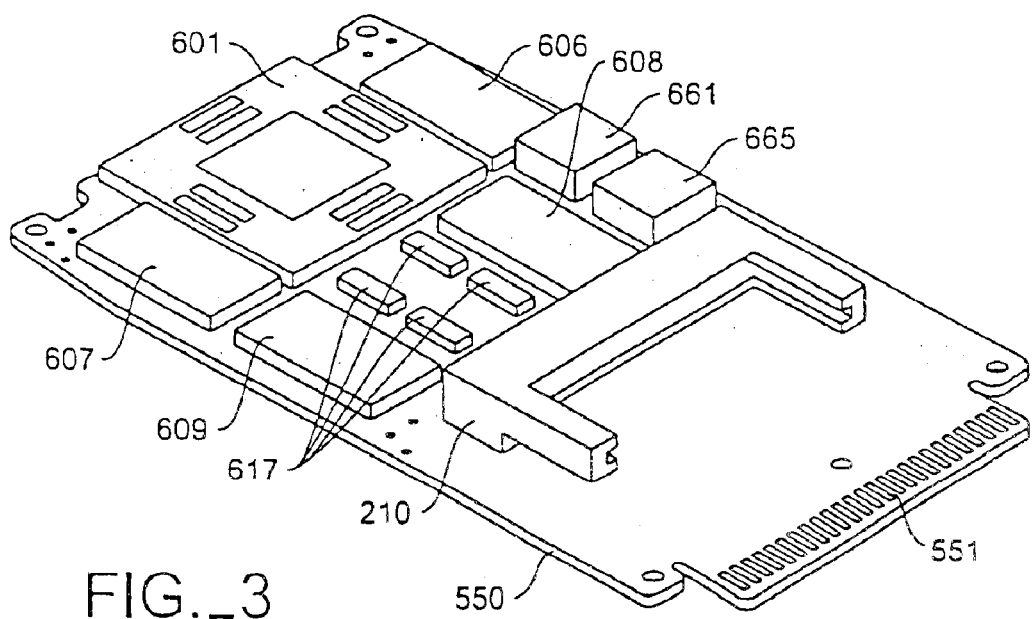
FIG._3

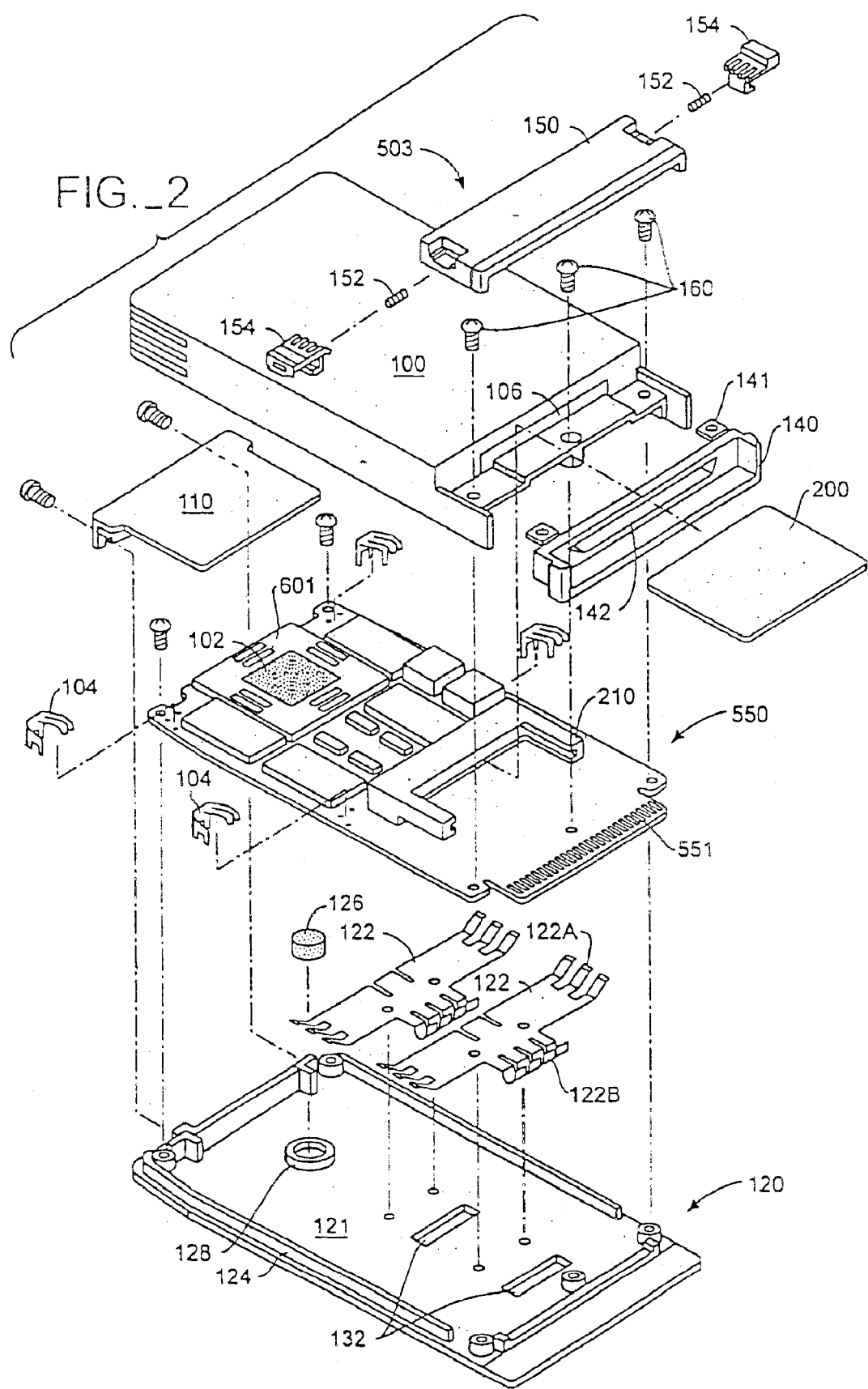
FIG._2

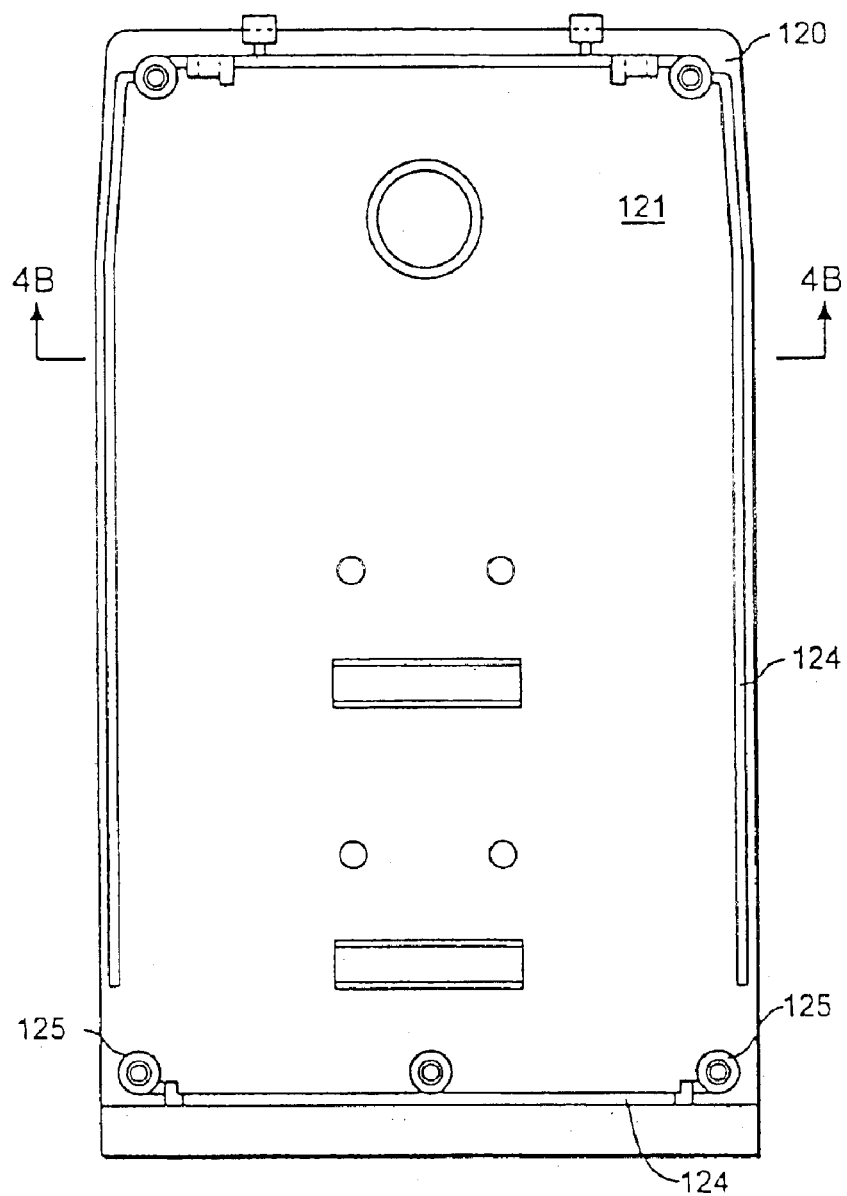
FIG._4A
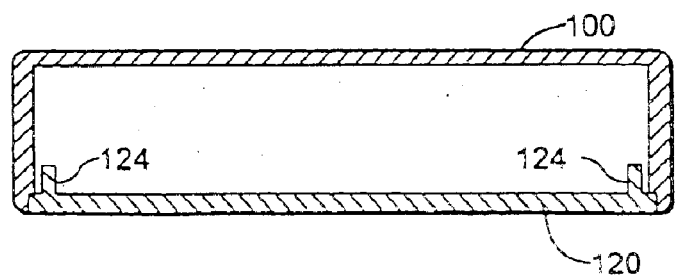
FIG._4B

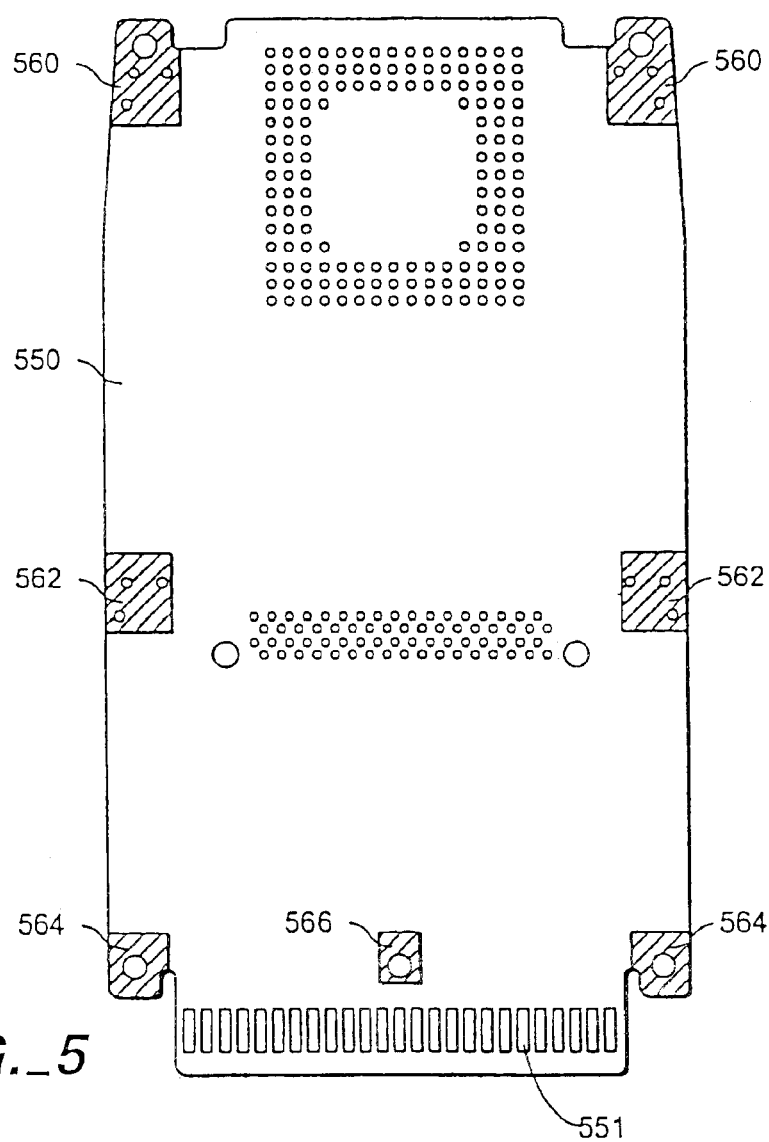
FIG._5
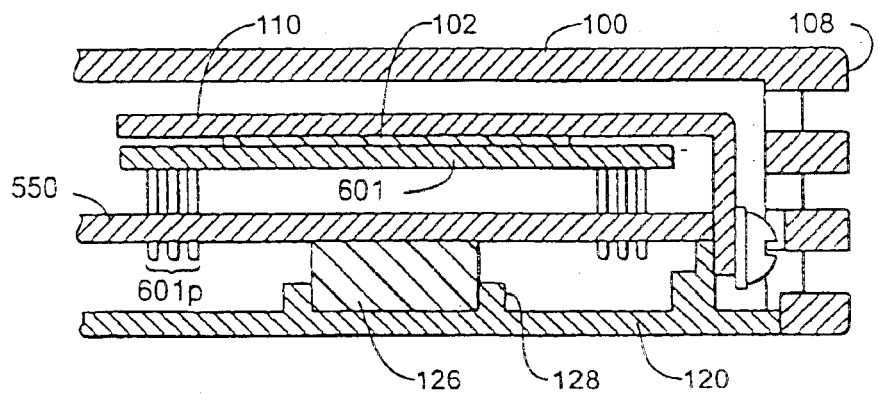
FIG._7

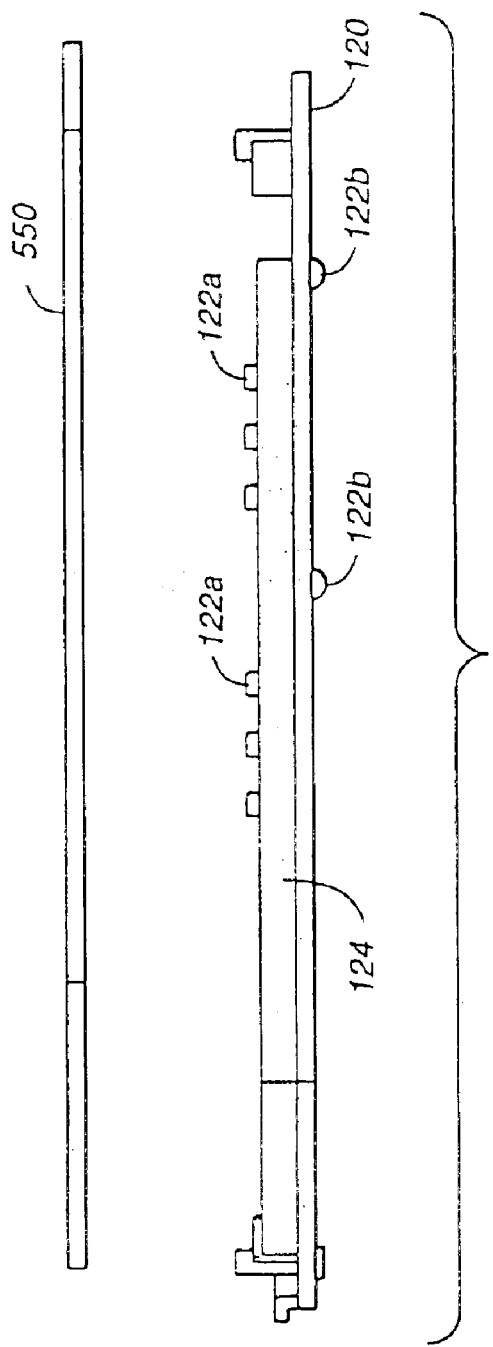
FIG._6A
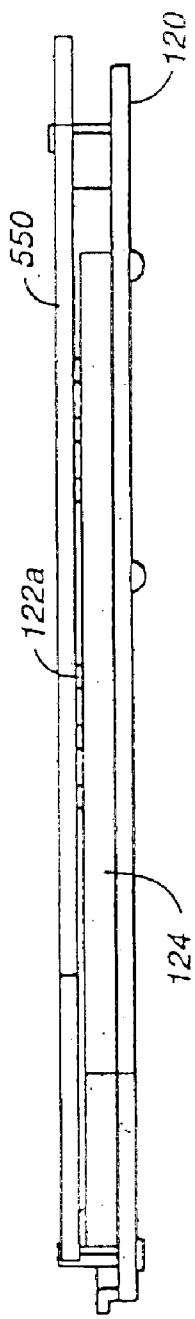
FIG._6B

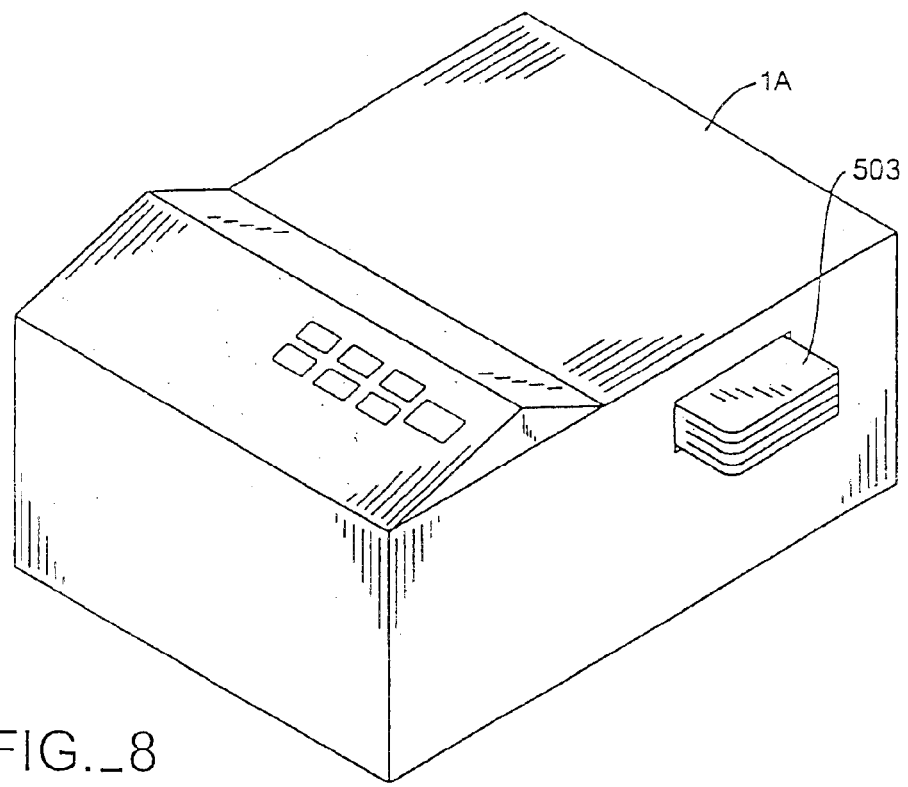
FIG._8
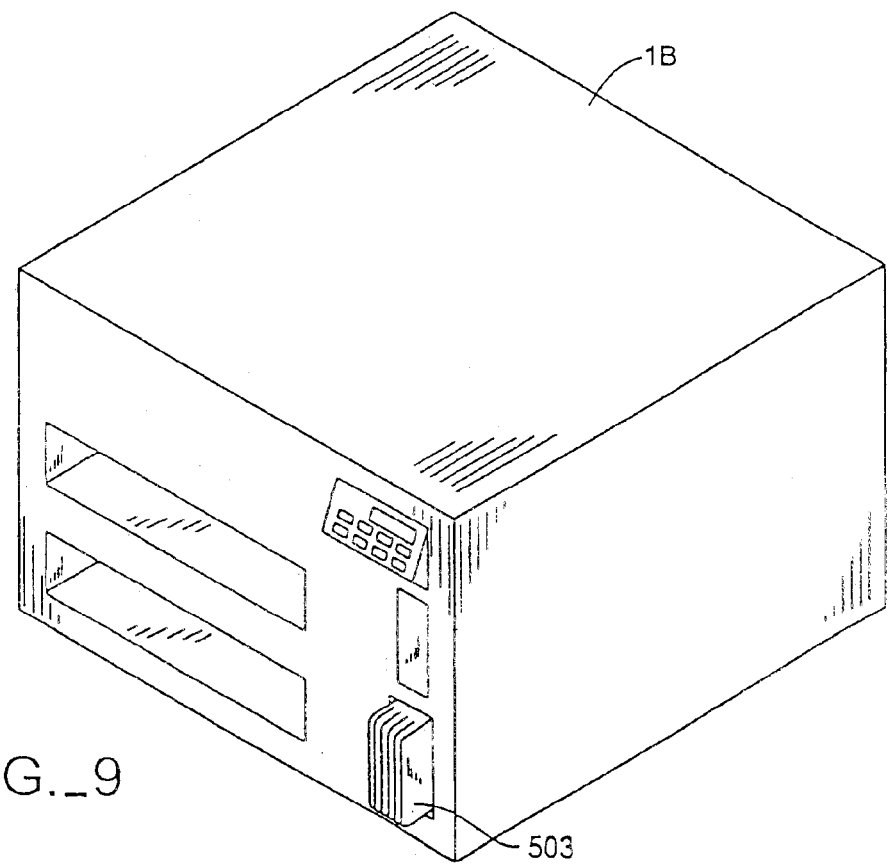
FIG._9

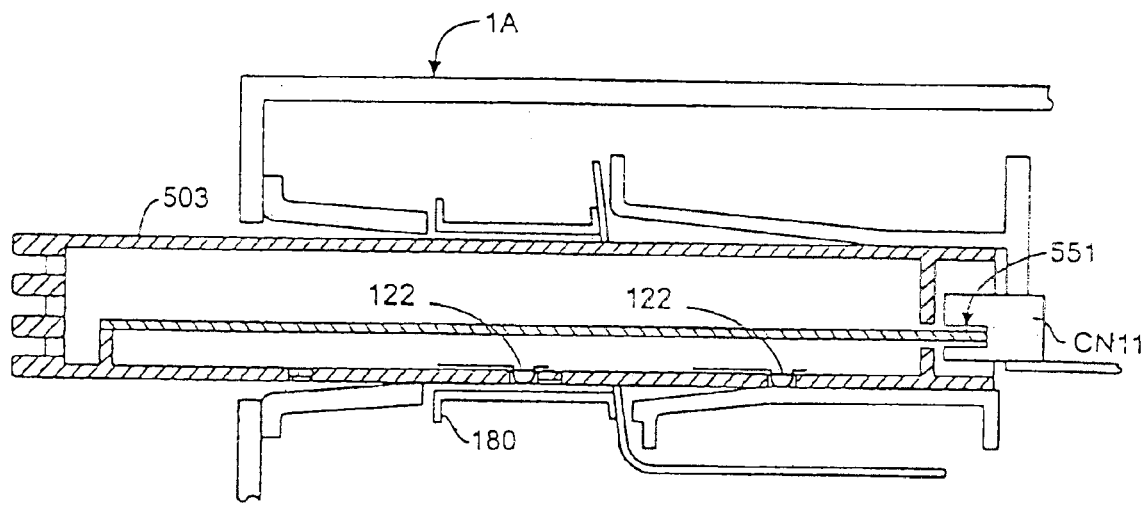
FIG._10
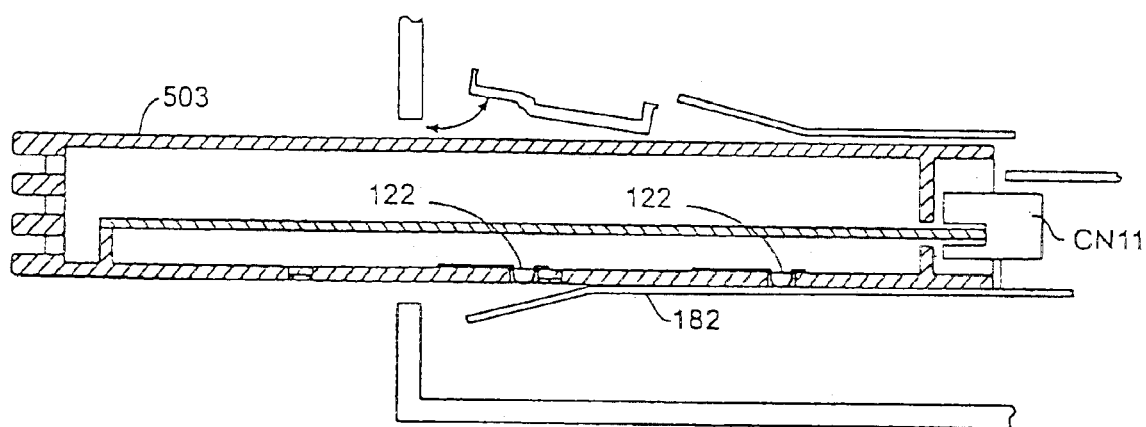
FIG._11

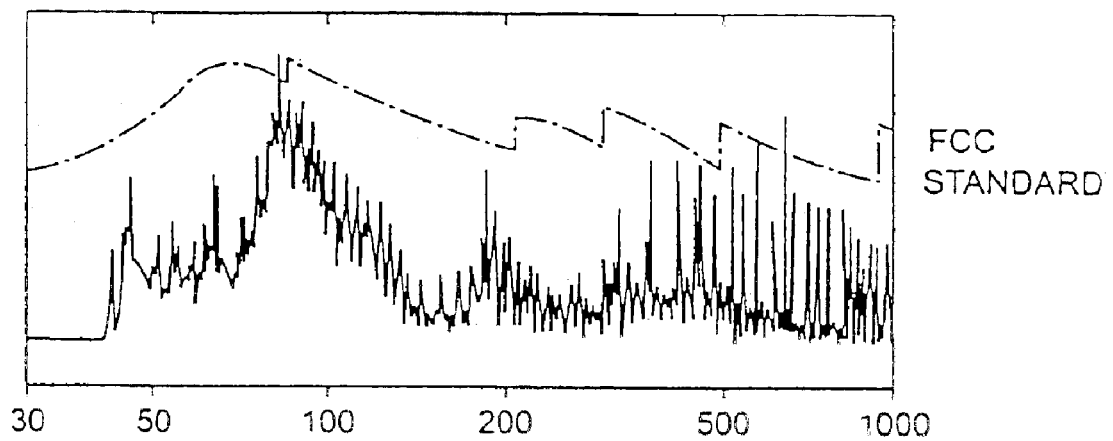
FIG._12A
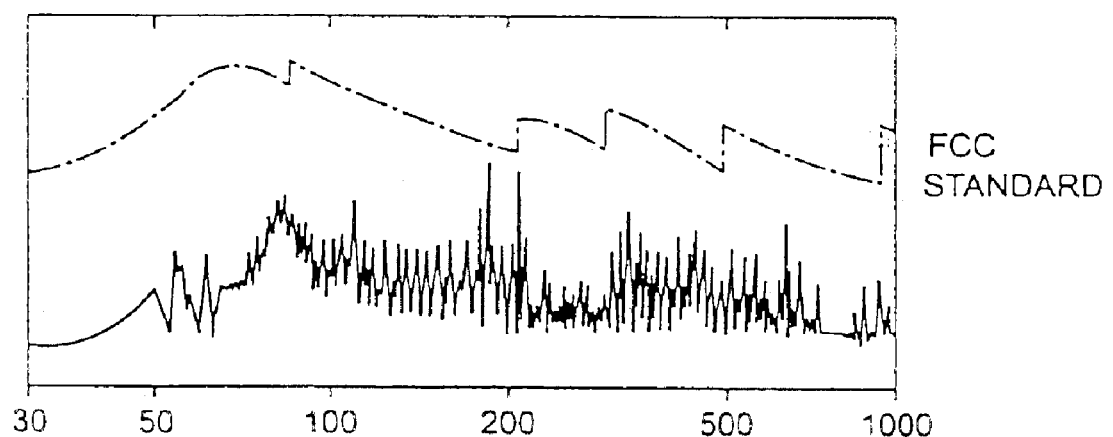
FIG._12B

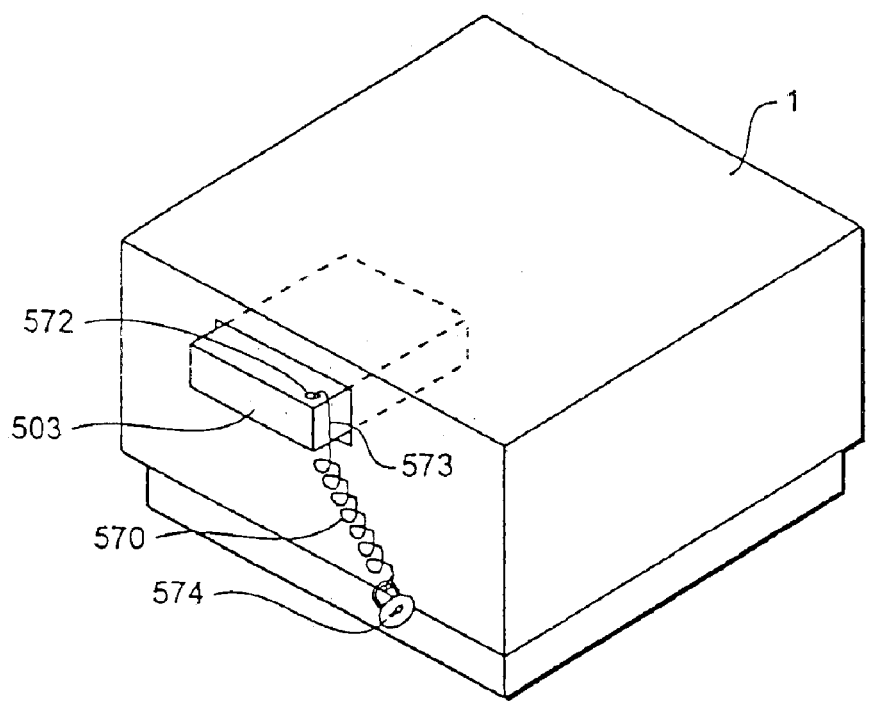
FIG._13
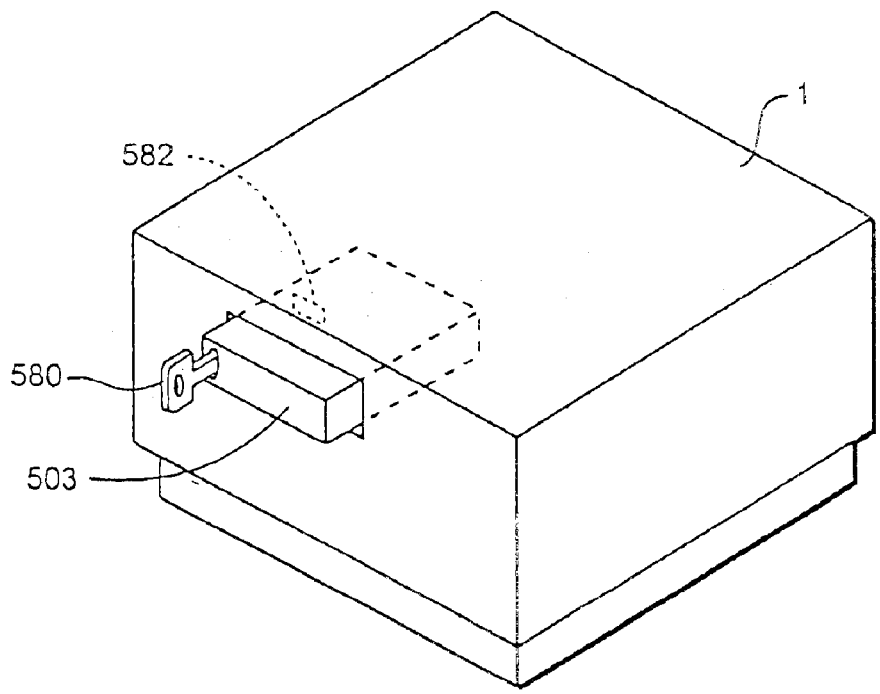
FIG._14

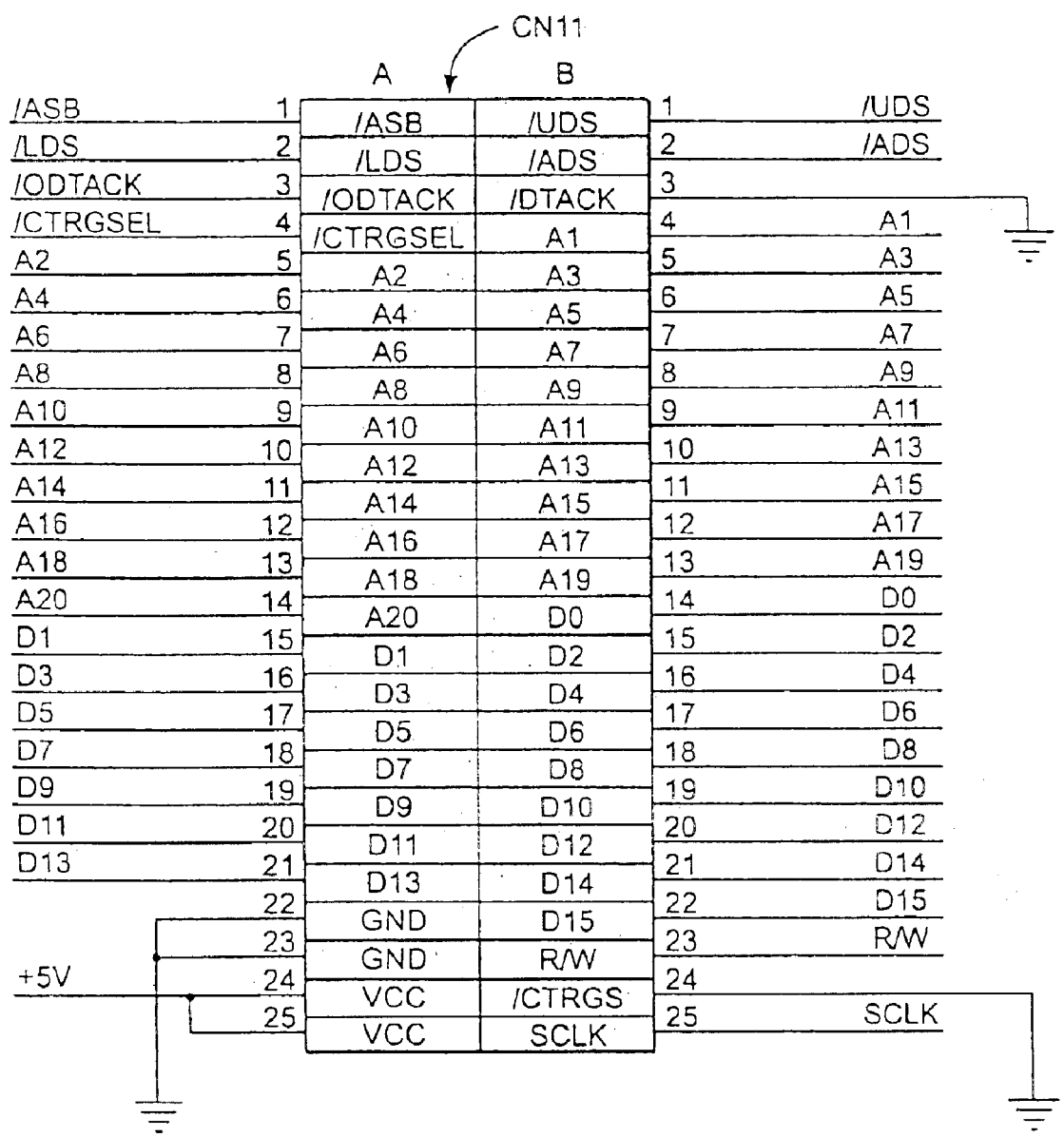
FIG._16
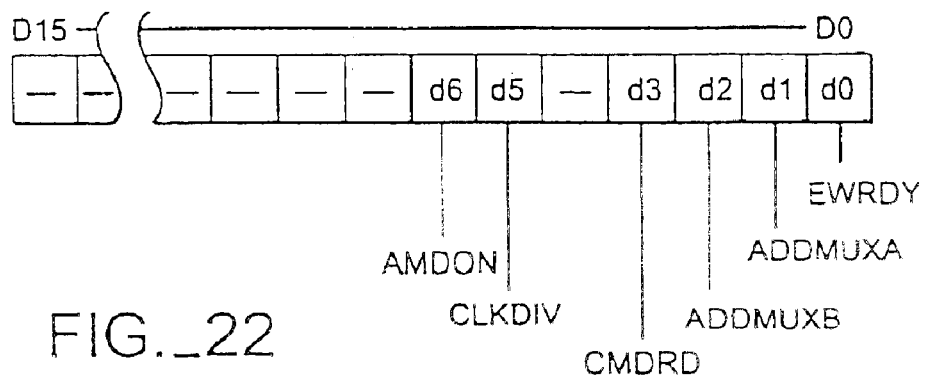
FIG._22

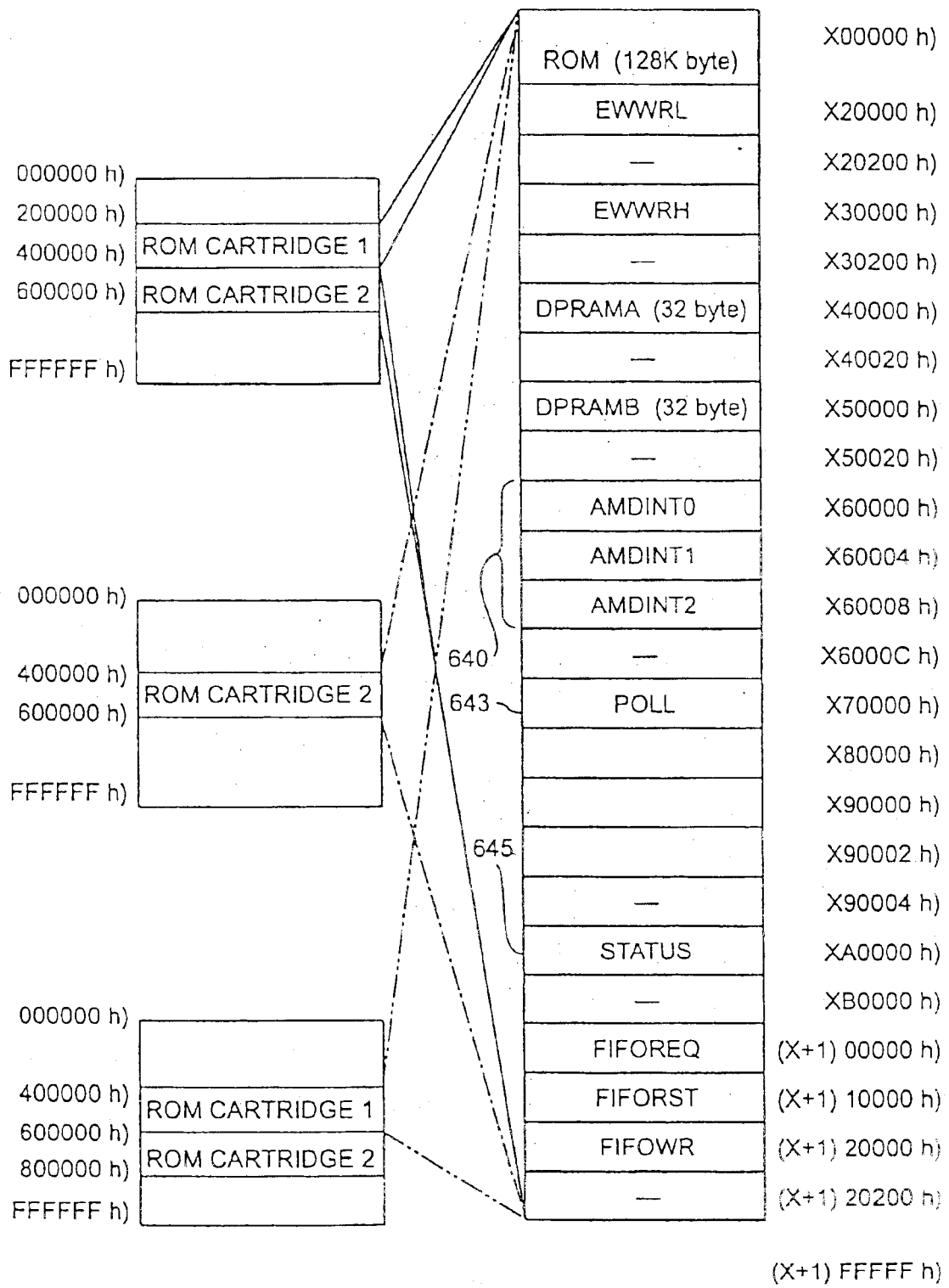
FIG._17

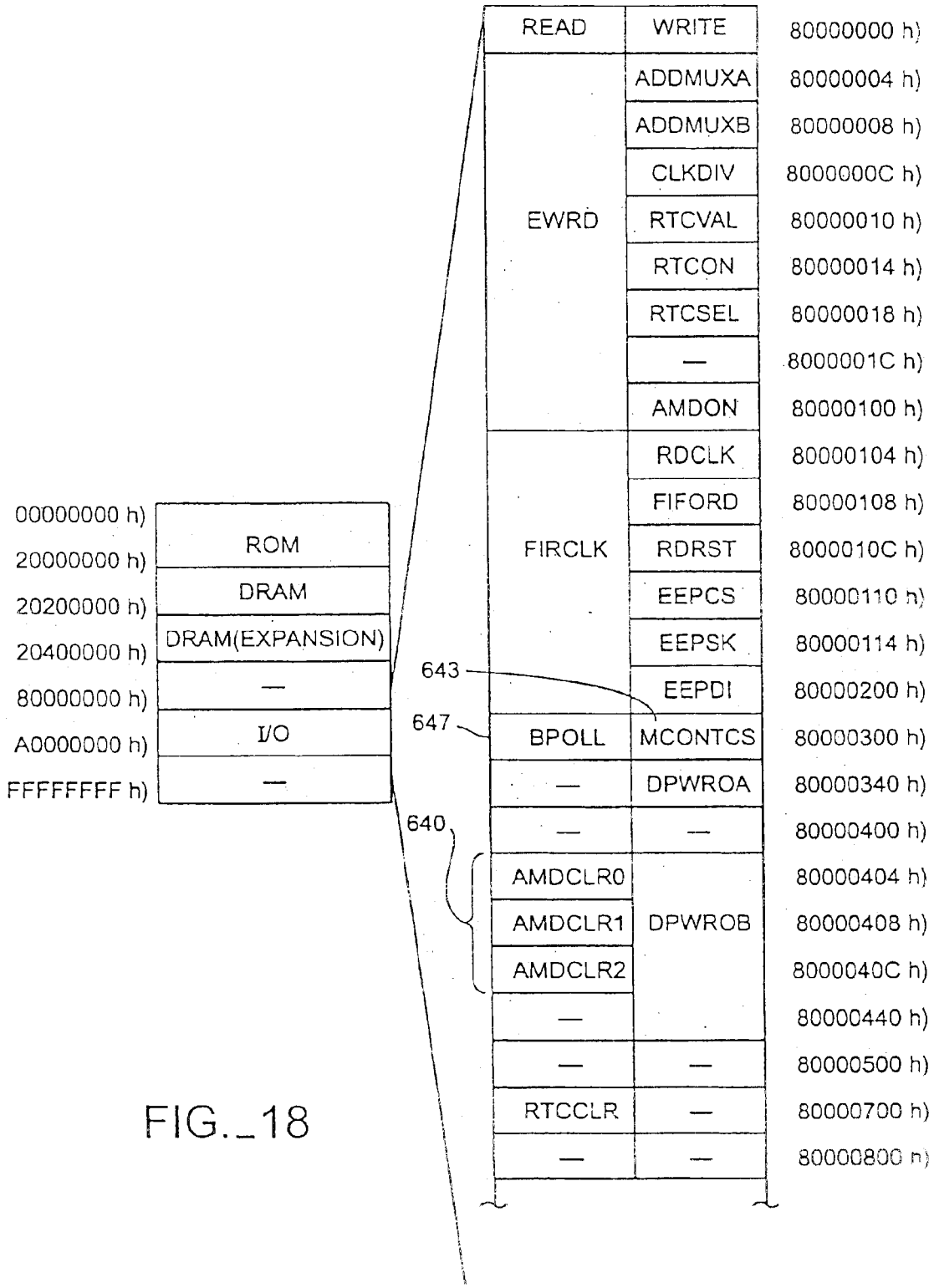
FIG._18

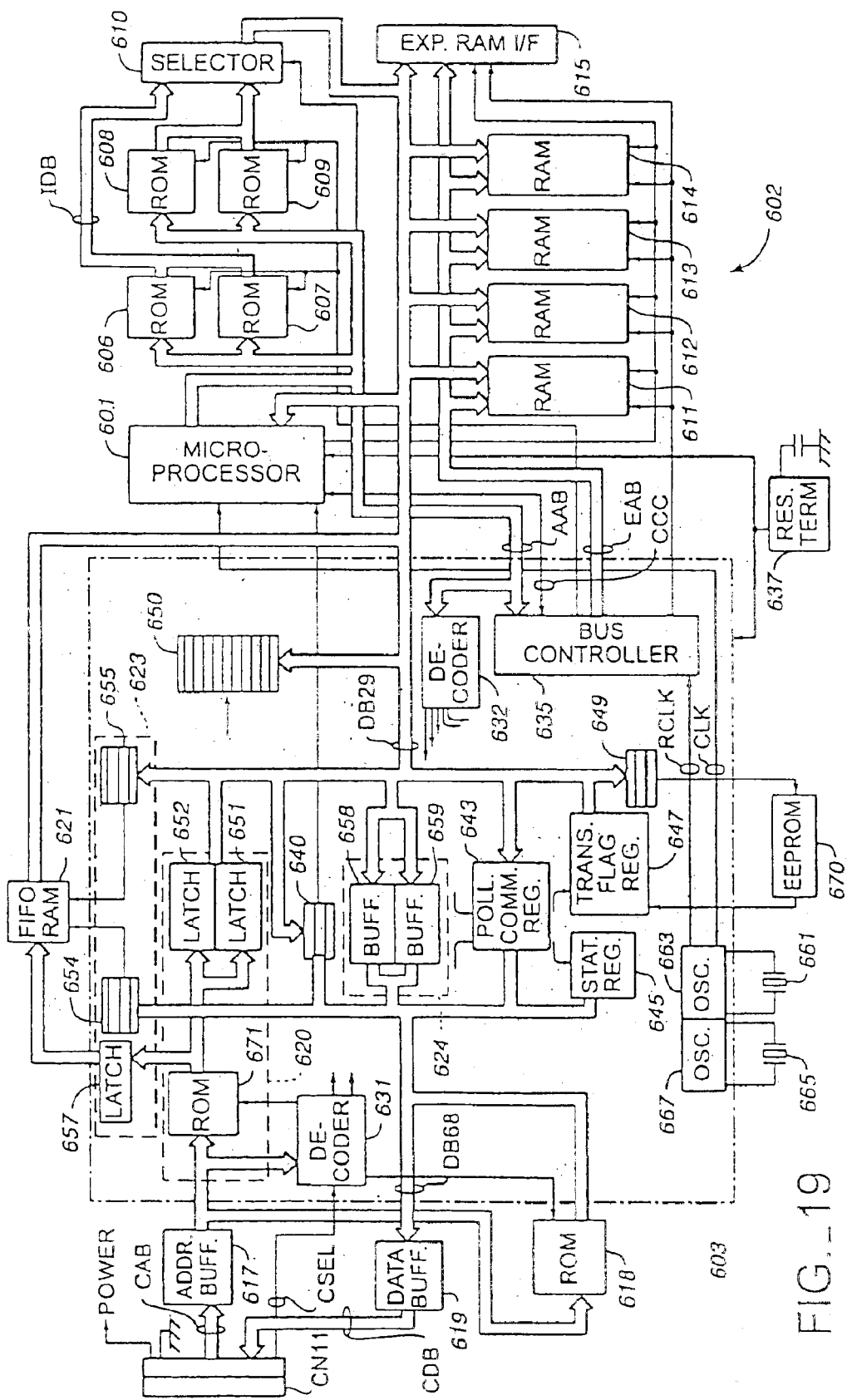
FIG._19

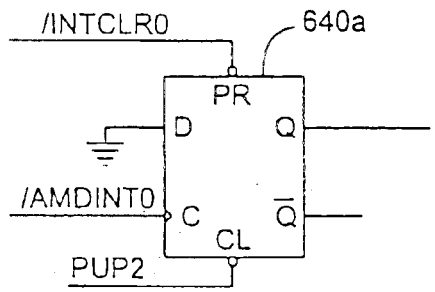
FIG._20A
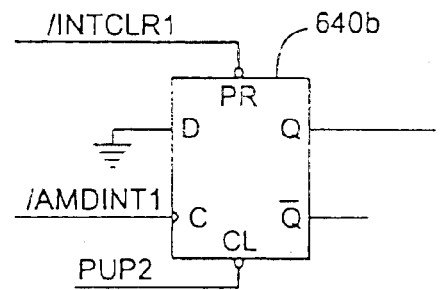
FIG._20B
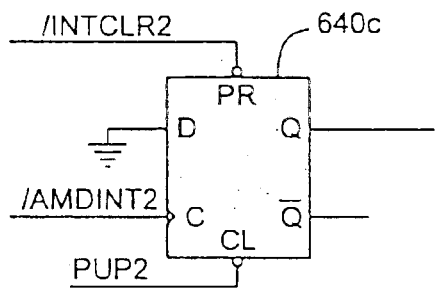
FIG._20C
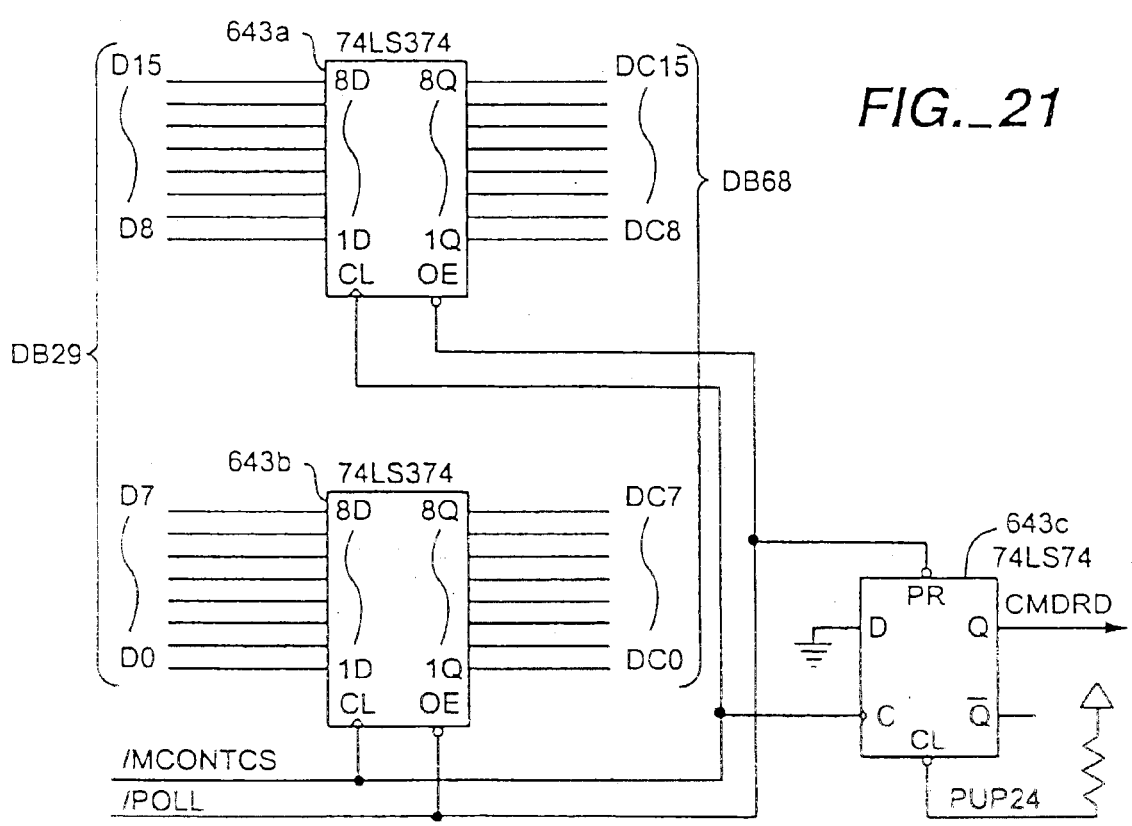
FIG._21

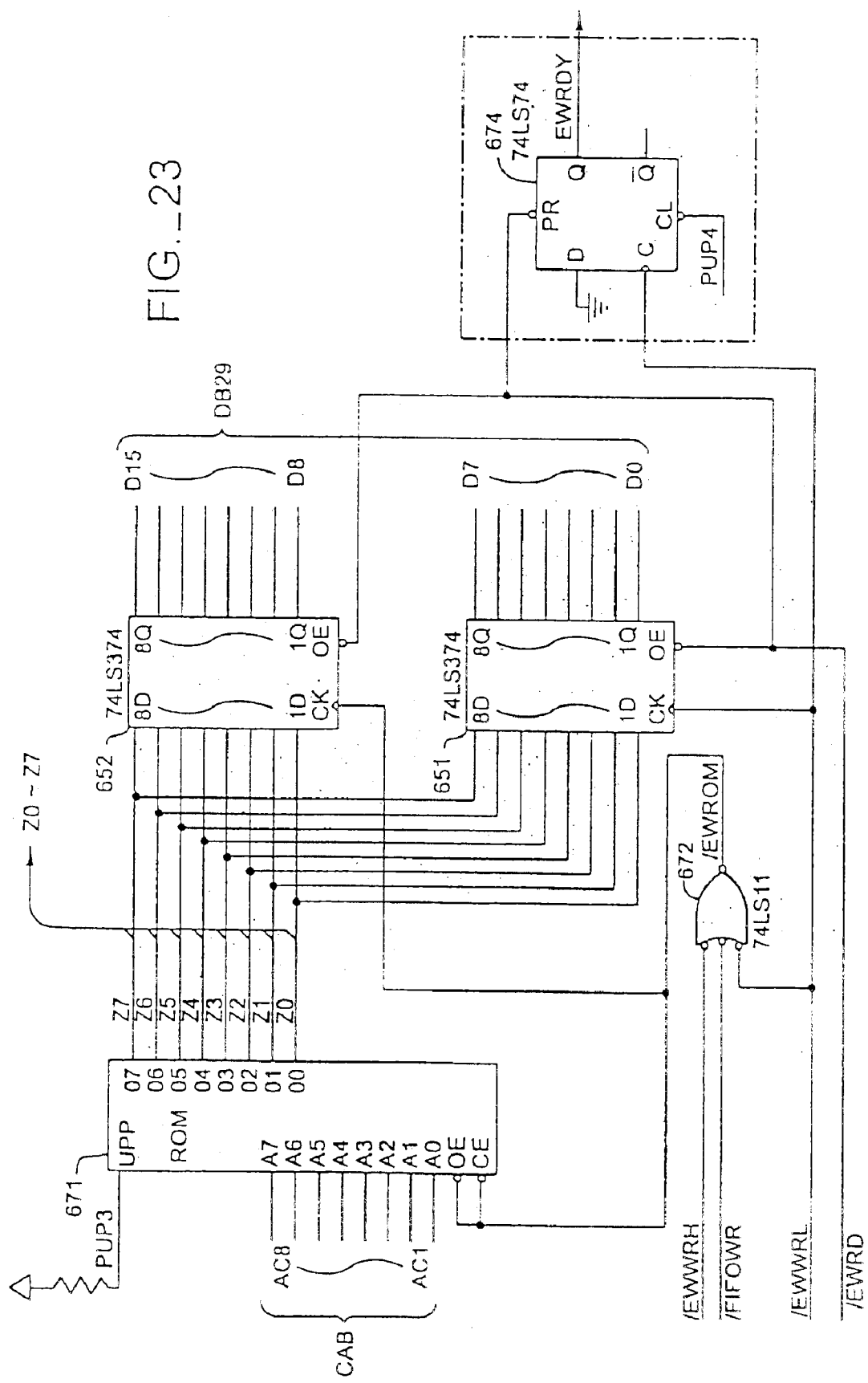
FIG._23

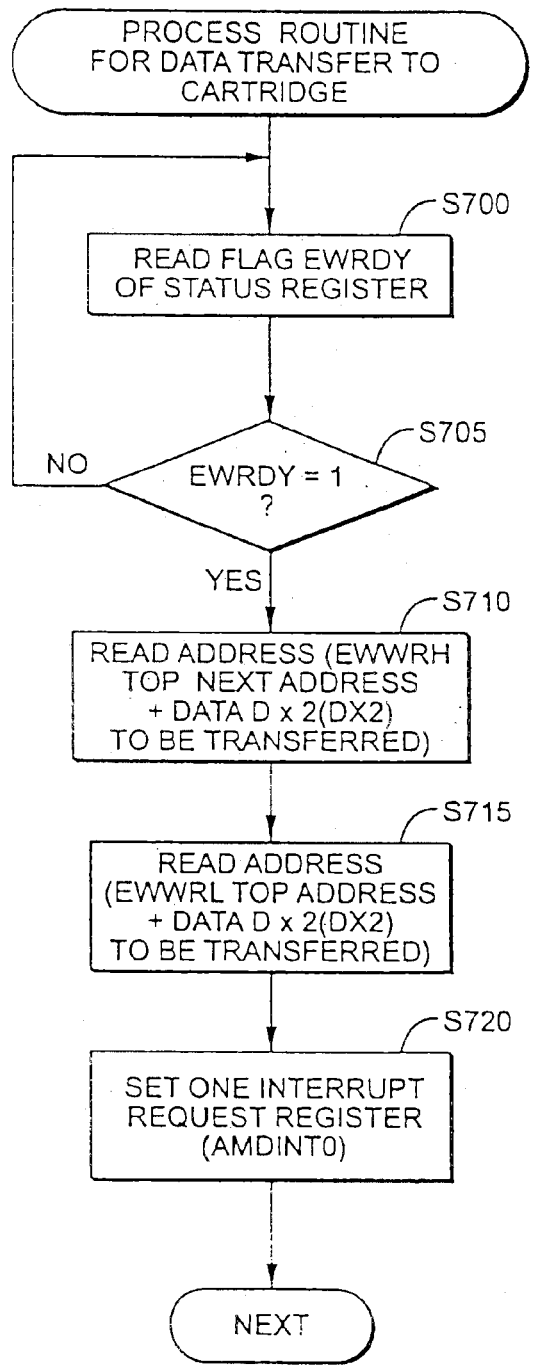
FIG._24
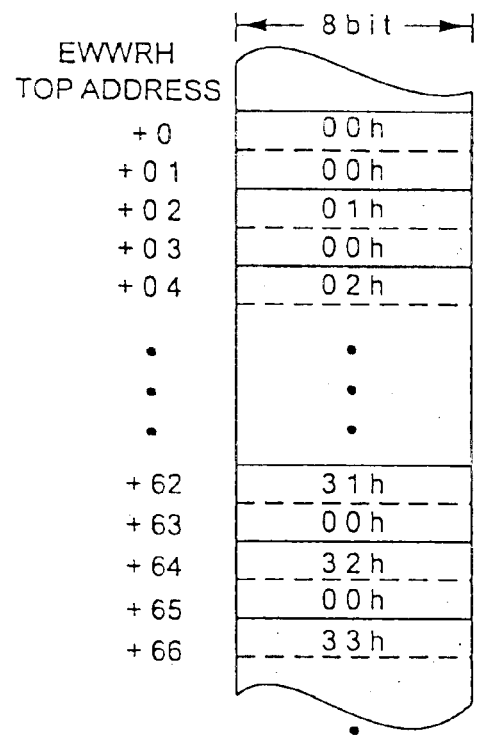
FIG._25
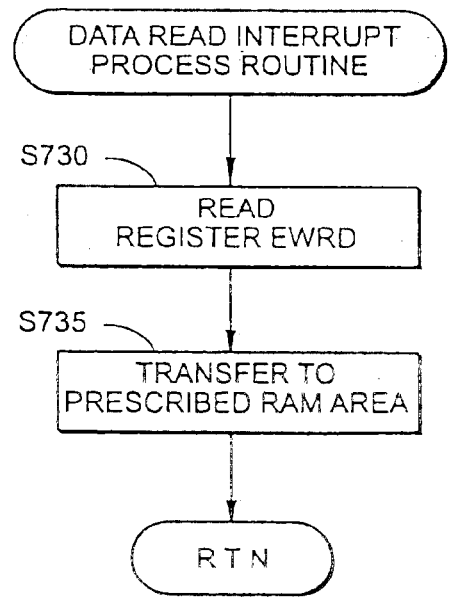
FIG._26

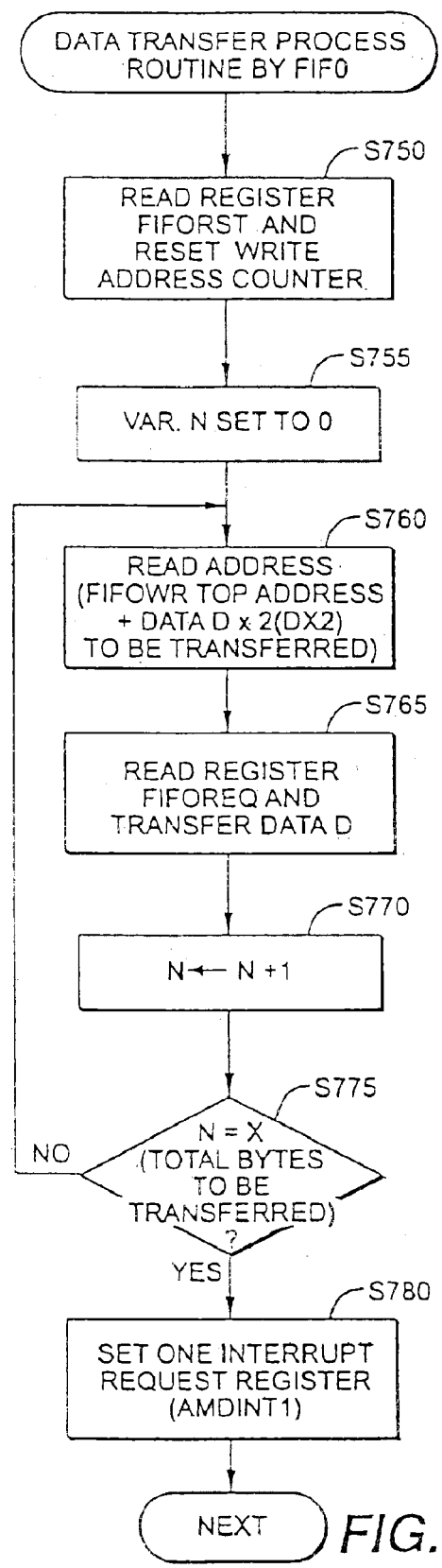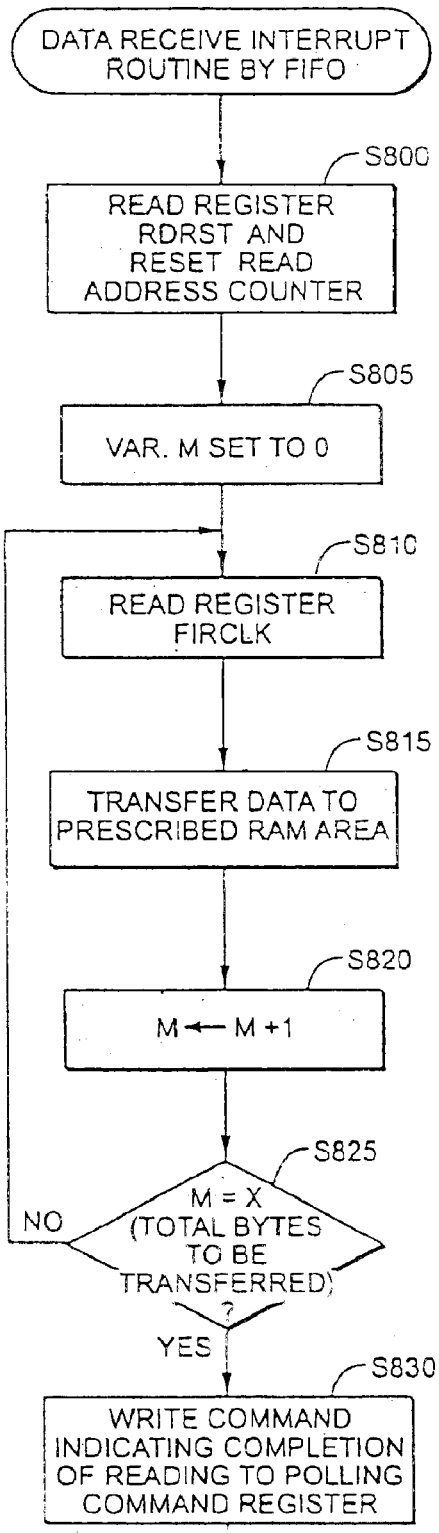
FIG._27
FIG._28

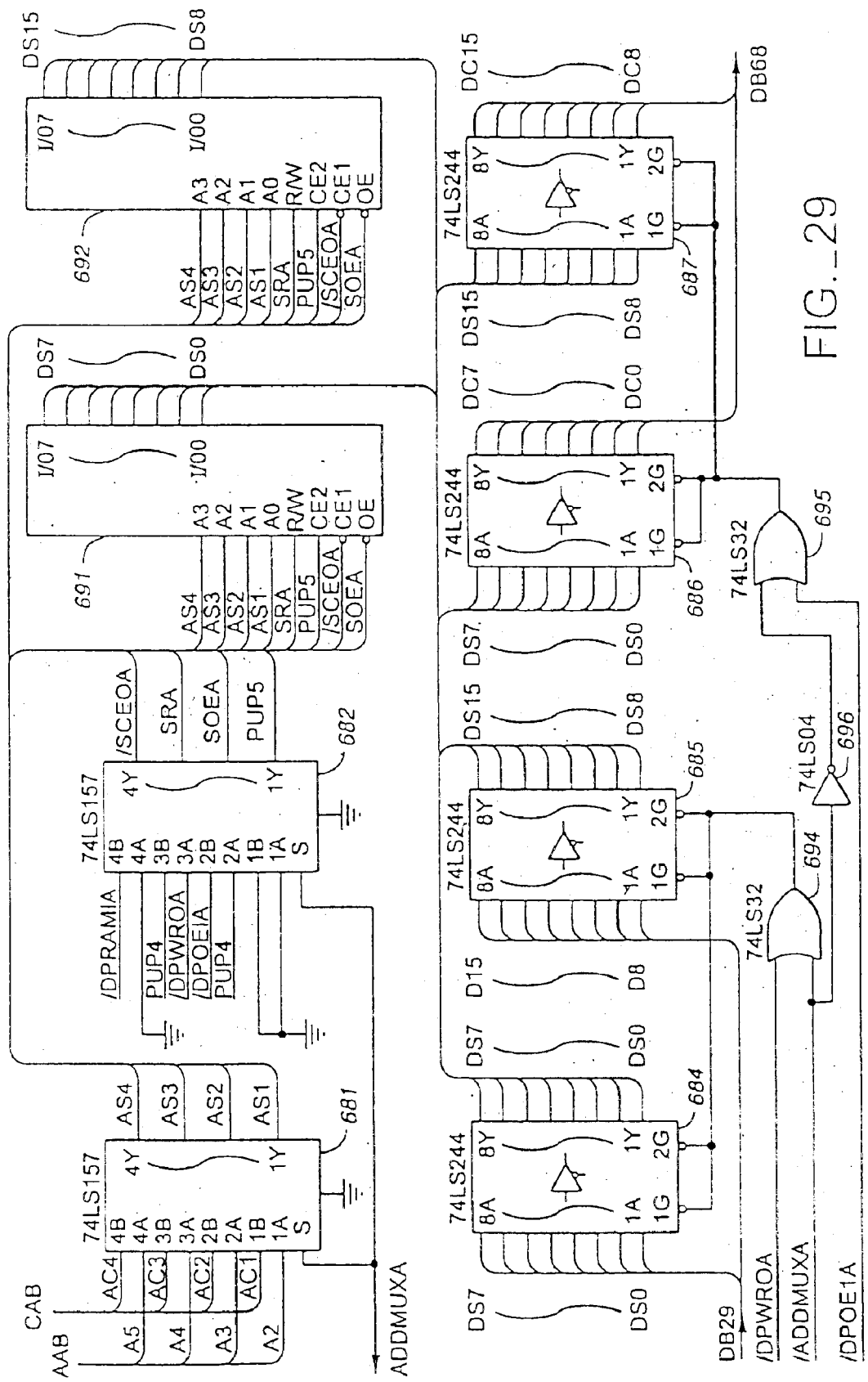
FIG._29

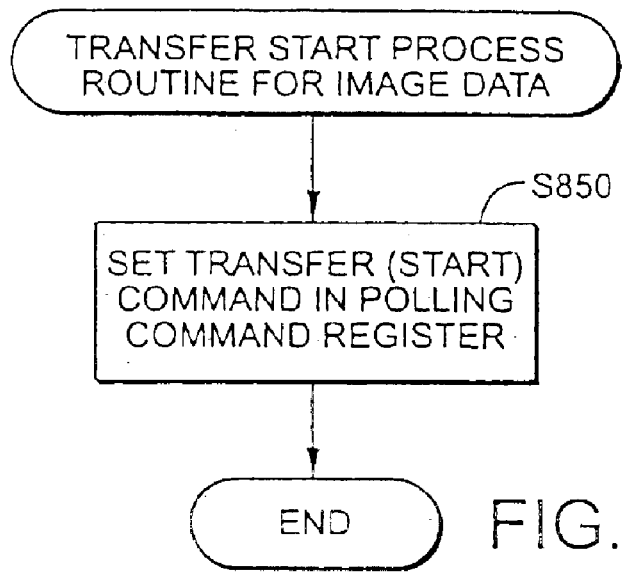
FIG._30
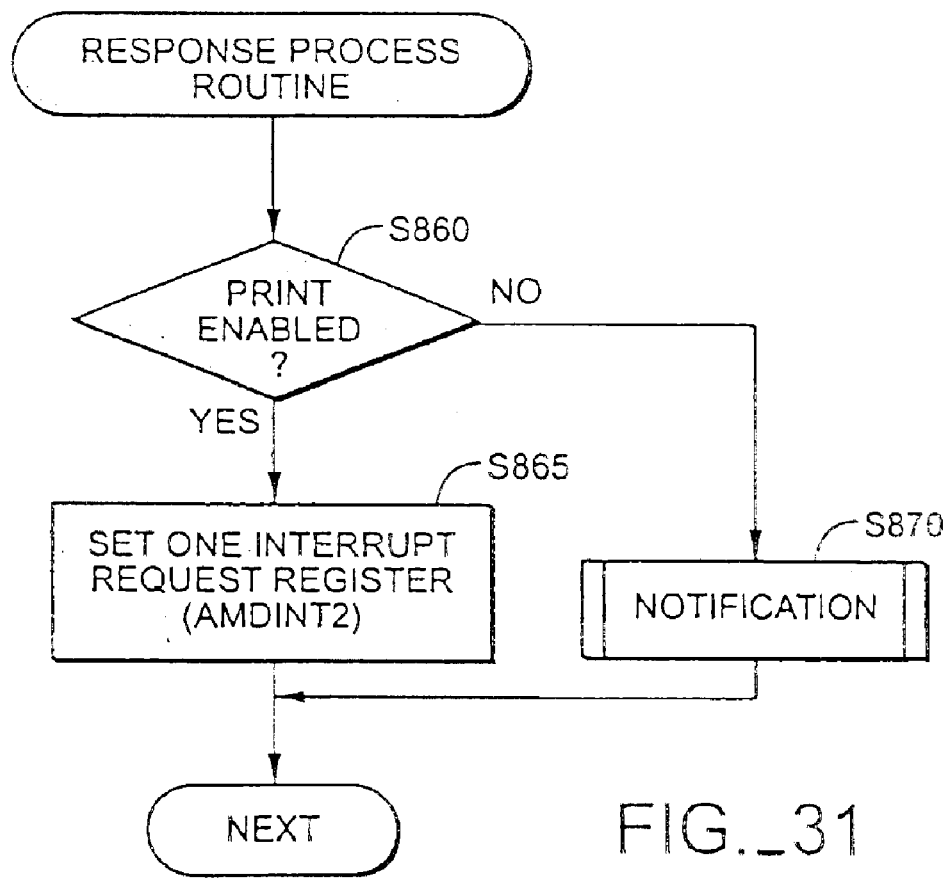
FIG._31

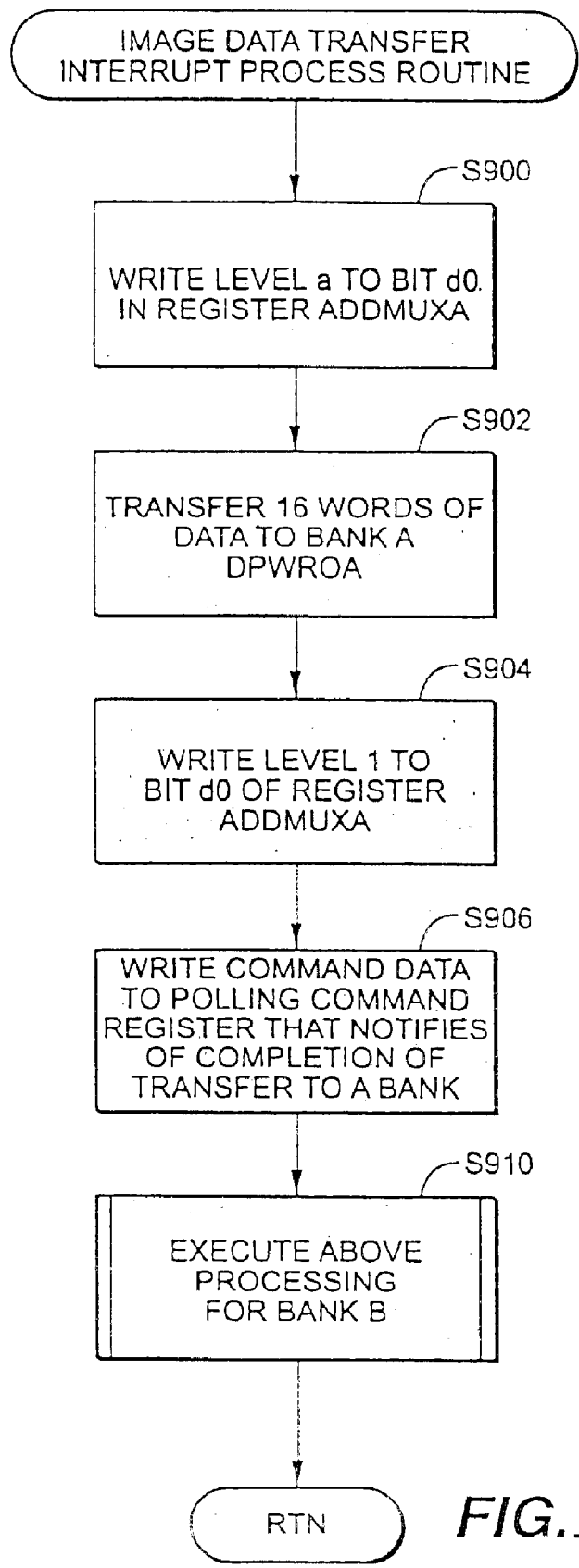
FIG._32

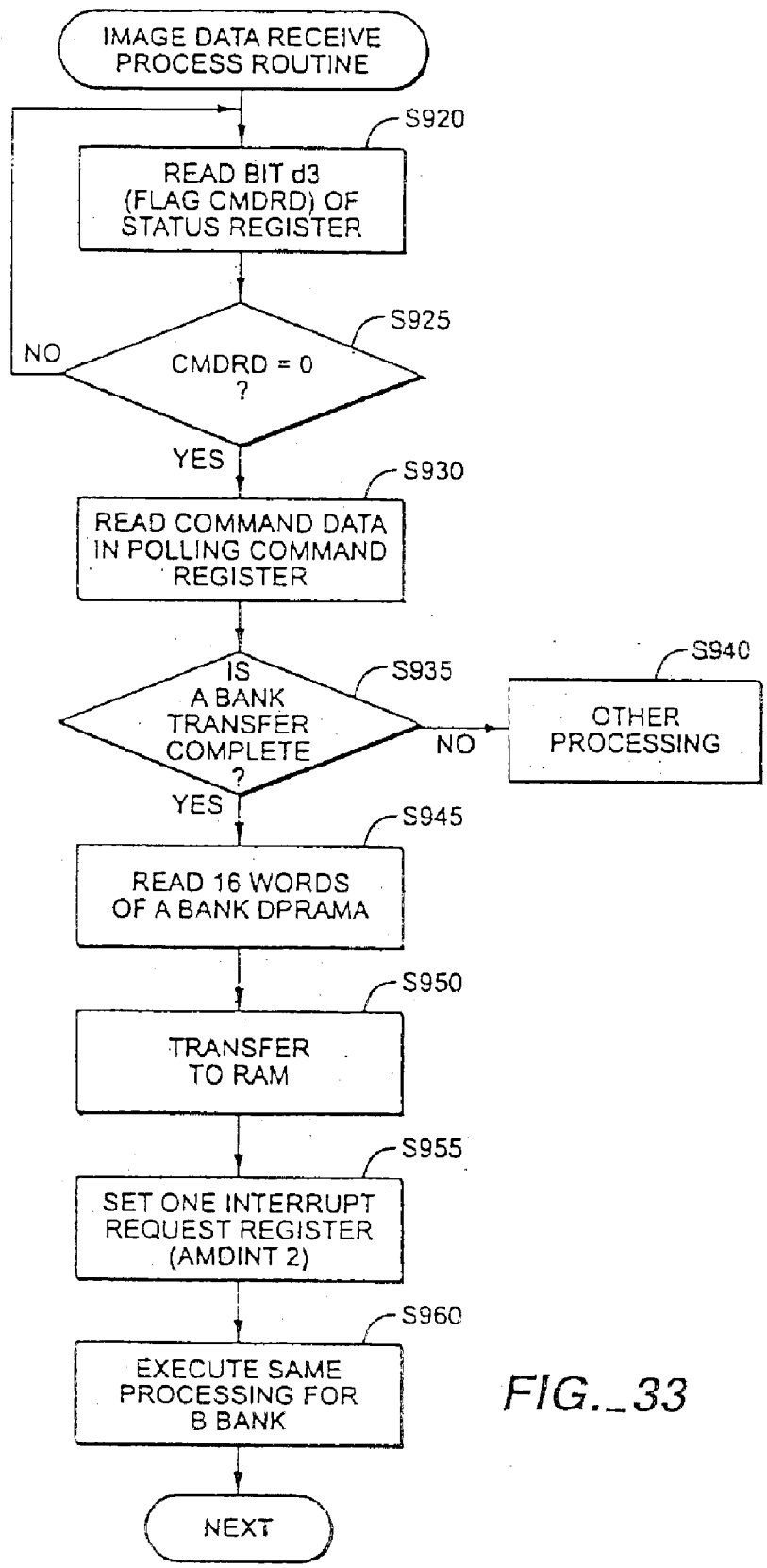
FIG._33

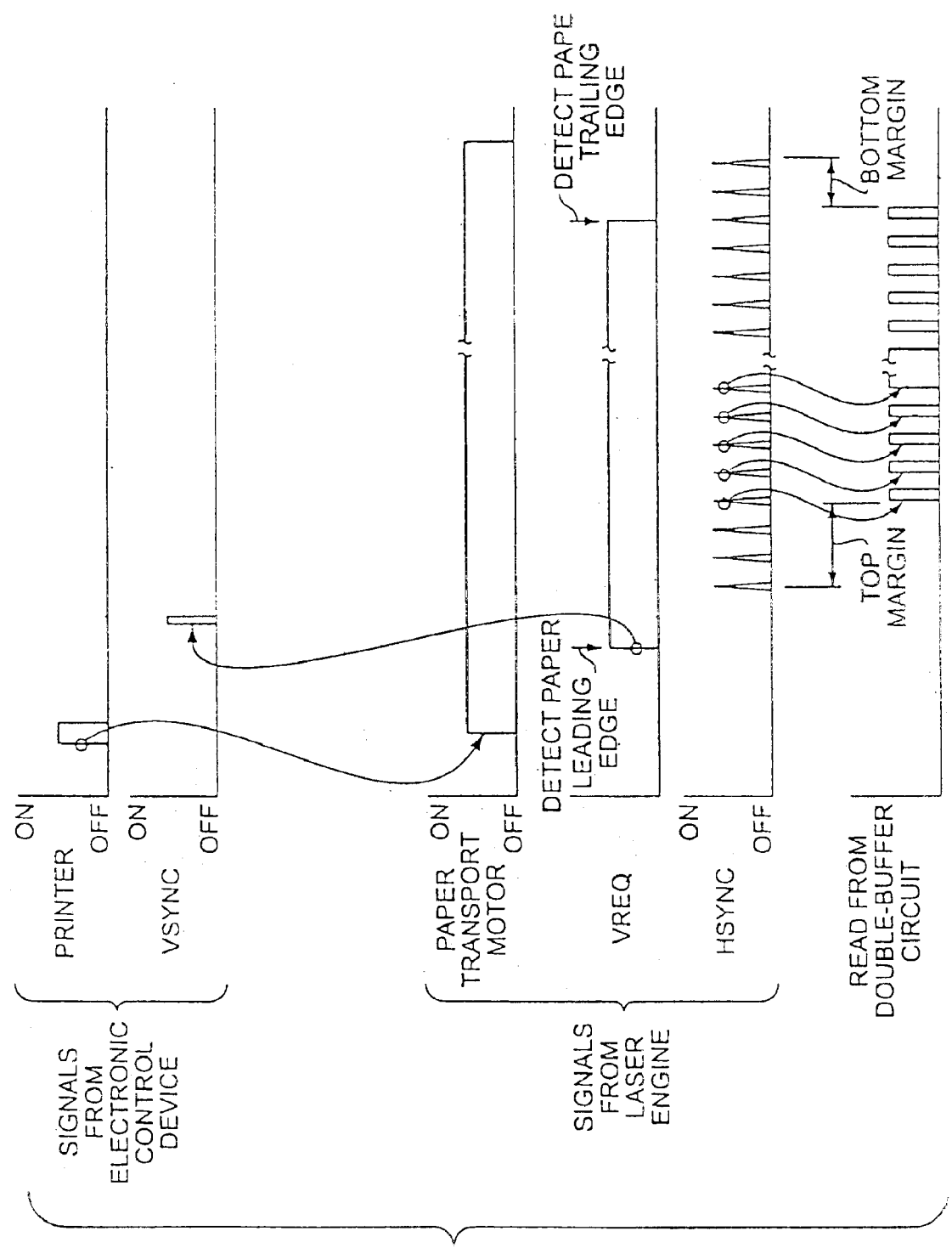
FIG._34

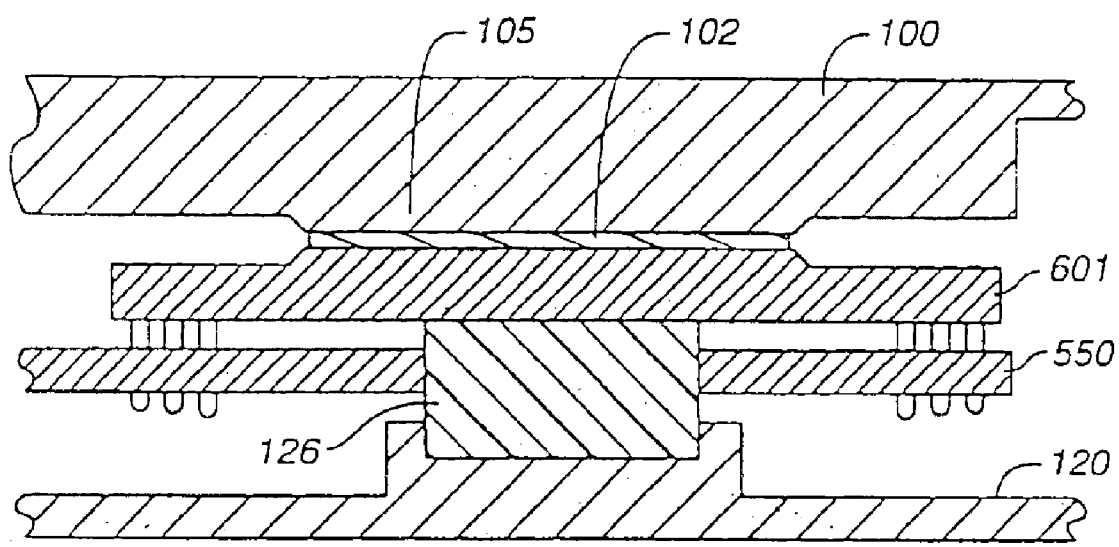
FIG._35

CARTRIDGE FOR ELECTRONIC DEVICES

CONTINUING APPLICATION DATA

This is a continuation application of prior application Ser. No. 10/442,873, filed May 21, 2003, now U.S. Pat. No. 6,771,509 which is a continuation of Ser. No. 10/315,781, now U.S. Pat. No. 6,608,753, filed on Dec. 10, 2002, which is a continuation of Ser. No. 10/128,731, filed on Apr. 24, 2002 now U.S. Pat. No. 6,515,864, which is a continuation of Ser. No. 09/452,625, filed on Dec. 1, 1999, issued as U.S. Pat. No. 6,404,639 which is a continuation of Ser. No. 08/866,195, filed on May 30, 1997, issued as U.S. Pat. No. 6,025,993, which is a continuation of Ser. No. 08/439,633, filed on May 12, 1995, issued as U.S. Pat. No. 5,659,459, which is a continuation of Ser. No. 08/026,902 filed on Mar. 5, 1993 which is now abandoned, the contents of such applications and patents are incorporated herein by reference.

CROSS REFERENCES TO RELATED APPLICATIONS

This application is also related to the following other applications:

"INTELLIGENT CARTRIDGE FOR ATTACHMENT TO A PRINTER TO PERFORM IMAGE PROCESSING TASKS IN A COMBINATION IMAGE PROCESSING SYSTEM AND METHOD OF IMAGE PROCESSING", Wakabayashi et al., Ser. No. 07/816,455, filed Dec. 30, 1991 (P16491a), issued as U.S. Pat. No. 5,410,641.

"INFORMATION PROCESSING DEVICE IN AN ELECTRONIC APPARATUS UTILIZING AN ACCESSORY CONTROL DEVICE AND METHODS OF APPLICATION", Wakabayashi et al., Ser. No. 07/883,753, filed May 15, 1992 (P16655a), issued as U.S. Pat. No. 5,461,705.

"INFORMATION PROCESSING DEVICE IN AN ELECTRONIC APPARATUS UTILIZING AN ACCESSORY CONTROL DEVICE AND METHODS OF APPLICATION", Wakabayashi et al., Ser. No. 07/895,537 (P16646a), filed Jun. 8, 1992, which is now abandoned.

"APPARATUS TYPE IDENTIFICATION DEVICE AND METHOD THEREFOR", Wakabayashi et al., Ser. No. 07/908,671 (P16619a), filed Jul. 2, 1992, which is now abandoned.

"INFORMATION PROCESSING DEVICE AND THE ACCESSORY CONTROL DEVICE AND INFORMATION PROCESSING METHOD IT USES", Wakabayashi et al., Ser. No. 07/910,590 P16628a), filed Jul. 8, 1992, issued as U.S. Pat. No. 5,553,202.

"ADD-ON ELECTRONIC DEVICE AND ELECTRONIC SYSTEM", Wakabayashi et al., Ser. No. 07/854,643 (P16637a), filed Jul. 1, 1992, issued as U.S. Pat. No. 5,437,041.

"INFORMATION PROCESSING DEVICE AND THE ACCESSORY CONTROL DEVICE AND INFORMATION PROCESSING METHOD IT USES", Wakabayashi et al., Ser. No. 07/910,851 (P16664a), filed Jul. 7, 1992, issued as U.S. Pat. No. 5,461,704.

"TEMPERATURE CONTROL FOR ADD-ON ELECTRONIC DEVICES", Wakabayashi et al., Ser. No. 07/907,988 (P16673a), filed Jul. 1, 1992, issued as U.S. Pat. No. 5,526,229.

"INFORMATION PROCESSING DEVICE AND THE ACCESSORY CONTROL DEVICE AND INFORMATION PROCESSING METHOD IT USES", Wakabayashi et al., Ser. No. 07/911,558 (P16682a), filed Jul. 7, 1992, issued as U.S. Pat. No. 5,504,669.

The applications listed above are incorporated herein by reference thereto.

BACKGROUND OF THE INVENTION

1. Field of the Invention

The present invention generally relates to plug in type cartridges for providing additional or new operating features for printers and other existing electronic systems, and more particularly to a method and apparatus for minimizing extraneous electromagnetic noise generated by such cartridge devices.

2. Description of the Related Art

In recent years, digital electronic equipment, such as, personal computers, word processors, work stations, and other electronic equipment using built-in microprocessors, such as printers, facsimile machines, memo devices, musical instruments, cooking equipment, and cameras, has found extensive use throughout large segments of society. In addition, other widely used apparatus such as automobiles, robots, numerically controlled machines, and a variety of other electrified products, now make use of microprocessor technology.

The application of programmable digital logic to equipment operation makes more flexible control possible compared to that obtained with simple feedback controls previously used with various fixed hardware designs. In addition, using programmable logic, essential operating functions are easily altered by simply changing command software. One advantage of this approach is that totally different control operations are obtainable for a given piece of equipment or hardware by simply modifying the contents of program storage or memory elements, such as ROMs, that store specific processing or program steps. Moreover, smaller incremental changes in function, such as occur for design revisions, can be advantageously implemented by only upgrading software.

However, the ultimate capabilities of processor controlled electronic equipment are determined by the capabilities of the processor itself. That is, each processor is itself finally limited by operating characteristics such as the maximum number of processing steps obtainable per unit time, the maximum number of data bits that can be processed at one time, the width of any data or command transfer buses, and so forth. As a result of these limitations, achieving improvements by merely upgrading software versions is at best limited to improving equipment ease of use. Realistically, it has not been possible to achieve significant improvements in operating functionality for existing electronic equipment.

At the same time, improving or upgrading software versions often requires replacing a ROM or other memory element in which the software is "burned" or contained. It is much more difficult to obtain access to or change software when replacement of such code containing ROMs is required. As a result, revising software to improve equipment operation is actually very difficult unless the particular piece of electronic equipment is already scheduled for a ROM exchange, different ROM version, at the time of its initial design, or unless the software can be supplied on a replaceable medium such as a flexible disk and used to modify stored program material.

For some applications, devices called "accelerators" are used to improve overall equipment function, operability, or capabilities by completely replacing key control components such as microprocessors which otherwise impose limits on operation. This type of hardware "upgrade" is commonly encountered with personal computers. However, this approach requires replacing components, a microprocessor, generally located on a motherboard within the apparatus, and represents a task that is beyond the skill of most equipment users. Furthermore, for typical consumer electronic equipment such as the previously mentioned printers, facsimile machines, musical instruments, cooking equipment, cameras, automobiles, etc., absolutely no consideration is commonly given to providing for such improvements or upgrading functionality and no such hardware option exists. A good example of this lack of planning is seen in relation to page printers which are manufactured for use with computers.

In recent years, page printers, such as laser printers, have enjoyed widespread distribution and are rapidly becoming the common, leading, device for high-speed data and image output from computers. The resolution of laser printers typically ranges from 240 to 800 dots per inch (dpi), and printing speed is on the order of several pages a minute. Such printers principally employ an electrophotographic printer element, such as a xerography unit, which uses a photosensitive drum as part of the printing engine. After the printer has received and stored one page of image data (or blank), image processing steps, that is, electrostatic charge, exposure, toner application, and image transfer, take place continuously in synchronization with rotation of the photosensitive drum.

Therefore, page printer memory capacity for image development or processing must be sufficient to store at least one page of image data at a time. If no image data compression is employed, this capacity is determined by the printer resolution being used and the page size to be accommodated. For example, if a resolution of 300 dpi and a page size of 8 by 10 inches are used, the printer may handle as much as 8×300×10×300 or 7,200,000 dots or pixels, of image data. If the print or image input data is in the form of a bit mapped image, the printer only needs to accept and sequentially store this data before image processing. The processing speed for this type of operation generally depends on, and is limited by, the data transfer rate. Since parallel data transfer, such as that complying with the Centronics specification standard, occurs at a considerably high rate, it is unlikely that data transfer of bit images will occur at a slower rate than the printing capability of the xerographic unit.

However, where printers receive and process other types of data, such as character codes, line positions, and line and character pitch, and then develop this data into a page image, or receive programs that describe the page using a page description language (PDL) and then interpret and process this information to generate a page image, it is necessary to perform arithmetic processing and generation of bit mapped images from the input print data. In comparison to directly transferring a simple bit image, the extra image processing overhead incurred by such processing imposes a major reduction in overall printing speed. That is, the image output speed of the printer is now substantially determined, or limited, by the speed with which the processor performs image processing and memory accesses which combine to create much slower transfer rates than the xerography unit is capable of handling, resulting in a major reduction in printing capability.

For example, in a page printer capable of printing ten pages a minute, no more than six seconds are allowed for processing image data for each page to be printed. Processing 0.9 megabytes of stored data into an image within this time span only provides for 6.67 microseconds of processing time per byte of data (6 seconds divided by 0.9 megabytes). Such short processing periods represent a processing capacity that may or may not be realizable even with currently available high-speed RISC type processors. In contrast to this processing limitation, the electrostatic image and photosensitive elements of a laser printer are often capable of easily printing ten or more pages per minute. As a result, under the current state of the art, the processing capability of a printer image data control unit represents a major bottleneck in improving overall printing speed.

Many page printers are provided with either an internal memory expansion capability or an expansion slot to provide some additional processing capacity. Where an expansion slot is provided, insertion of an "add-on" or expansion "cartridge", containing font information or a program, expands printer functionality. The addition of pre-formed fonts and font control language to the printer may speed image formation by alleviating the need for some image processing steps. However, even if processing speed is increased using some form of memory expansion, it is not possible to improve the processor performance itself or data throughput. For example, for a laser printer only supporting one particular PDL, PDL interpreter programs are typically available in the form of integrated circuit cards and add-on cartridges for expanding processing functions to accommodate other page description languages. Such cartridges store programs, or special program routines, typically in mask ROM form for recall during image processing, and are inserted into the expansion slot of the printer. But the basic printer processor is unchanged and may even run slower implementing these routines.

Expansion cartridge slots have a specific address, or address range or space assigned to them which is detected and read by a printer control unit after power is applied to the printer. If a cartridge containing a PDL interpreter program has been inserted, and, therefore, resides at the appropriate addresses, a pre-selected code is returned to the controller to indicate that the cartridge contains a PDL program. In this situation, control of the printer for image data developing switches to the interpreter program which is read from its address locations inside the cartridge. As a result, the printer is able to interpret received data based on the use of the particular PDL implemented by the cartridge program. The use of an interpreter program does not itself increase the processing speed and the overall printing speed may in fact decrease as a result of employing a high level description language with the printer processor.

For this and other reasons, a cartridge equipped with a second microprocessor separate from that normally used by the main printer has been invented to resolve the problems described above. This cartridge and certain of its features are disclosed in the co-pending U.S. patent applications listed above which are incorporated herein by reference. The disclosed cartridge is able to receive print data from the printer and use its own microprocessor to process and develop image data based on stored PDL interpreters and other program data, and then provide print data back to the printer for forming the desired output image.

The operation of this type of cartridge creates potential problems regarding heat radiation and accumulation. Any advanced microprocessor used in the cartridge comprises an electronic circuit having from tens to hundreds of thousands of components or elements, such as transistors, which operate, or switch between operating states, at frequencies of 20 MHz to 40 MHz, or higher. As a consequence, such microprocessors typically generate substantial amounts of heat during operation, increasing the operating temperature of the microprocessor structure, and potentially generating errors or causing physical deterioration and destruction if the heat is not adequately dissipated. This situation is exasperated by operating within a very confined cartridge volume.

To date, expansion cartridges have not used microprocessors so that there has been no need for, nor effort expended to create, a cartridge heat dissipation structure. The heat dissipation problem for add-on cartridges or integrated circuit assemblies is not limited to printers but also extends to other add-on products having microprocessors or other sophisticated components. In general, it is a common problem with add-on electronic devices that are installed in most electronic equipment.

In order to prevent malfunction of, or damage to, elements in the cartridge, the cartridge housing or casing is typically designed to maintain a maximum temperature of about 80° C. In order to maintain the surface temperature within tolerances, or below a preset value, it is important to devise a cartridge structure that makes it easy to dissipate heat from any microprocessor or other heat generating components within the cartridge to the surrounding environment.

To assist with thermal dissipation, this type of add-on device or cartridge employs a thermally conductive housing or case typically made from aluminum which allows conduction and radiation of heat to the surrounding environment. While a conductive housing effectively intercepts electromagnetic radiation, it can also re-radiate the deposited energy if it is not re-directed to a suitable ground or fixed voltage potential. This could generate noise in, or spurious interference with, sensitive components and circuitry positioned adjacent to the housing. Depending on the method of manufacture, such housings or cases also often provide through-paths along which electromagnetic radiation can "leak" when circuits are operating at certain desired frequencies.

What is needed is a new method and apparatus for dissipating heat generated in add-on circuits while reducing undesirable electromagnetic radiation and signal noise outside of the cartridge.

SUMMARY OF THE INVENTION

In order to solve the problems encountered in the art, one purpose of the present invention is to provide an add-in cartridge for electronic equipment which has improved electromagnetic radiation isolation.

An advantage of the cartridge is that any transfer of undesirable electromagnetic radiation to a surrounding environment from a built in microprocessor and other circuit elements is greatly reduced.

An additional purpose of the invention is to offer a cartridge for electronic devices which is capable of efficiently cooling internal circuit elements.

Another advantage of the invention is that a cost effective minimum complexity solution is provided for heat dissipation problems.

These and other purposes, objects, and advantages are realized in an add-on or add-in electronic circuit or cartridge which is configured for insertion into a predesigned connector or receptacle in an electronic device. The electronic device has an insertion opening or slot for receiving the cartridge, and at least a first processor for performing certain predefined logical operations within the electronic device. The cartridge is provided with conductive shielding positioned around or adjacent to at least certain noise producing portions, and at least one electrical conductor or conductive element which is connected between the shielding and at least one conductive element or surface, such as an interior support frame, within the electronic device. By providing the cartridge with conductive shielding, transfer of electromagnetic radiation based noise to a surrounding environment is effectively inhibited. Entire electronic systems can be developed using this type of cartridge structure to minimize the impact of extraneous electromagnetic radiation.

A first memory in the electronic device is connected to the first processor and used to store programs or processing steps for execution by the processor. An address signal line is also coupled between the processor and the add-on or add-in connector. An address output element or controller is connected in series with the address signal line and the add-on connector which converts print and command data into address signals which are transferred to the cartridge through the connector. Therefore, a read-only address line reflects data to be processed outside of the electronic device.

The cartridge employs a second, generally digital, processor which performs certain logical operations independent of those of the first processor and is preferably mounted on a circuit board. Conductors may also be used to electrically connect the shielding, fixed potential conductors on the circuit board, and the electronic device conductive element. This results in stabilization of any potential difference between the shielding, the circuit board, and the electronic device the cartridge is installed in, which prevents generation or transfer of electromagnetic noise resulting from currents between these elements.

A second memory is generally used in the cartridge to store programs or steps executed by the second processor and a data fetch device that fetches or decides data reflected in the address information transferred from the electronic device connector, or address line.

The add-in cartridge generally houses the circuit board in a case which incorporates the shielding and at least part of the case is metal with the remainder being provided with at least a layer or coating of conductive material. The case is generally manufactured using first and second mating case elements or shells. An overlapping ridge or shoulder is formed adjacent to the matting surfaces to preclude formation of a through-path for radiation. A layer of conductive material is formed on, and adjacent to, mating surfaces of at least one of the two case elements, to prevent noise producing electromagnetic radiation from escaping through the mating joint of the two case elements. This is particularly important for portions of the cartridge that may protrude from the electronic device when the cartridge is installed. In one embodiment, one of the two case elements is manufactured from a plastic material, and the other from a metallic material.

Connection elements should electrically connect conductors on the circuit board to the shielding at multiple locations to reduce any impedance between the two to effectively prevent the generation of high frequency noise. If the case is manufactured with a through-hole, such as for an electrical plug which interfaces with the electronic device, shielding connections should bridge at least one intermediate position within the through-hole. This position is typically located at a midpoint between ends of an elongated through-hole from which a connector plug protrudes. Since the wavelength of electromagnetic radiation that can be emitted from the through-hole is reduced by this configuration, harmful electromagnetic noise at the wavelengths of interest, such as that specified in government regulations, is effectively reduced.

The connection elements may also include one or more elastically deformable conductive elements electrically connected to the shielding, which have a portion that protrudes outside or the cartridge through an opening in the case. The protruding elements also electrically connect to a conductive element or surface within the electronic device when the cartridge is installed. Preferably, multiple elastic conductive elements are used to assure that at least one forms an adequate electrical connection with conductive surfaces in the electronic device. The multiple conductive elastic members may also electrically connect the shielding and fixed potential or power source conductors on the circuit board.

With respect to heat dissipation characteristics of the cartridge, metallic heat dissipation material is secured to the inside of the case and adjacent to a top surface of the second processor with an intervening thermal transfer element being disposed between and in contact with the two. This allows heat generated by the second processor to be dissipated to the outside through the heat dissipation material and the case. Furthermore, if an elastic biasing element is provided which pushes the second processor toward the heat dissipation material, the thermal resistance between the second processor, intervening member and heat dissipation member is reduced.

In further embodiments, an expansion memory connector is provided on the circuit board, along with an expansion access slot in the cartridge housing and a removable expansion slot cover. This configuration allows easy addition of memory as required for specific applications by simple insertion of expansion memory cards into the expansion memory connector. However, the expansion slot cover should be disposed in a position that is hidden inside the electronic device when the cartridge is inserted in the electronic device to prevent inadvertent removal or insertion of expansion memory while the cartridge is in use. Configuring the expansion memory as an IC card greatly simplifies memory expansion.

By also providing the cartridge with a joining device that mechanically joins the cartridge and the main electronic device, such as to the device housing, theft of the cartridge can also be prevented. The joining device may also employ a locking device which incorporates an electrical switch which can be connected to the power source for the cartridge. Therefore, in this embodiment locking the cartridge in place also activates the cartridge.

In further aspects of the invention the cartridge uses an address output means that reflects the data to be transferred to the outside in an address signal and outputs the address signal via the connector, a second memory that stores the procedures executed by the second processor, a data fetch device that fetches data reflected in the address from the address signal output from the electronic device, a circuit board on which are mounted the second processor, the second memory and the data fetch device.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 illustrates a perspective view of one embodiment of a cartridge structure constructed according to the principles of the present invention;

FIG. 2 illustrates an exploded perspective view of the cartridge of FIG. 1;

FIG. 3 illustrates an enlarged perspective view of a printed circuit board used in the cartridge of FIG. 1;

FIG. 4A illustrates a plan view of a lower case of the cartridge of FIG. 1;

FIG. 4B illustrates an end view of a lower case of the cartridge of FIG. 1;

FIG. 5 illustrates a plan view of the printed circuit board of FIG. 3 without components installed;

FIG. 6A illustrates a side view of the printed circuit board of FIG. 3 positioned above the lower case of FIG. 4;

FIG. 6B illustrates a side view of the printed circuit board of FIG. 3 mounted in the lower case of FIG. 4;

FIG. 7 illustrates an enlarged cross-sectional view of the cartridge of FIG. 1 showing principal parts positioned near a cartridge microprocessor;

FIG. 8 illustrates a perspective view of the cartridge of FIG. 1 inserted in one type of printer;

FIG. 9 illustrates a perspective view of the cartridge of FIG. 1 inserted in another type of printer;

FIG. 10 illustrates a longitudinal cross section of the cartridge of FIG. 1 inserted in a printer frame of a first type;

FIG. 11 illustrates a longitudinal cross section of the cartridge of FIG. 1 inserted in a printer frame of a second type;

FIG. 12A graphically illustrates electromagnetic noise measurements taken before implementing noise countermeasures;

FIG. 12B graphically illustrates electromagnetic noise measurements taken after implementing noise countermeasures;

FIG. 13 illustrates a cartridge joined to a printer using a chain;

FIG. 14 illustrates a cartridge having a keyed lock mechanism;

FIG. 16 illustrates a configuration for signal lines in a printer connector;

FIG. 17 illustrates an address map for a cartridge when viewed from the point of view of an electronic control device;

FIG. 18 illustrates an address map for a cartridge when viewed from the point of view of a cartridge microprocessor;

FIG. 19 illustrates a block diagram of a cartridge constructed according to the invention;

FIGS. 20A, 20B, and 20C illustrate schematics of exemplary circuits useful for implementing interrupt request register 640 of FIG. 19;

FIG. 21 illustrates a schematic of an exemplary circuit useful for implementing polling command register 643 of FIG. 19;

FIG. 22 illustrates explanatory contents of status registers 645 of FIG. 19;

FIG. 23 illustrates a schematic of an exemplary read control circuit 620 as used in FIG. 19;

FIG. 24 illustrates a flowchart of processing steps used by control circuit 501 of FIG. 19 for transferring data using read control circuit 620;

FIG. 25 illustrates an exemplary data structure inside of a storage ROM used in the cartridge of FIG. 19;

FIG. 26 illustrates a flowchart of processing steps performed by the cartridge of FIG. 19 for using a read control circuit 620 to transfer data;

FIG. 27 illustrates a flowchart of processing steps used by the electronic control device of FIG. 9 to transfer data using a FIFO control circuit;

FIG. 28 illustrates a flowchart of processing steps performed by the cartridge of FIG. 19 for transferring data using a FIFO control circuit;

FIG. 29 illustrates a schematic of an exemplary double-bank control circuit for use in the cartridge of FIG. 19;

FIG. 30 illustrates a flowchart of processing steps used for starting the transfer of data with the double bank control circuit of FIG. 29;

FIG. 31 illustrates a flowchart of response processing steps executed in the electronic control circuit of FIG. 15;

FIG. 32 illustrates a flowchart of processing steps executed for transferring data using the double-bank control circuit of FIG. 29;

FIG. 33 illustrates a flowchart of processing steps used for receiving data using the double bank control circuit of FIG. 29;

FIG. 34 illustrates graphical representations of the timing relationships involved in printing image data by controlling the laser engine 505 with an electronic control circuit; and FIG. 35 illustrates a cross section of major components of a cartridge using a compressible material to push directly on a microprocessor;

DESCRIPTION OF THE PREFERRED EMBODIMENTS

Figure 15:
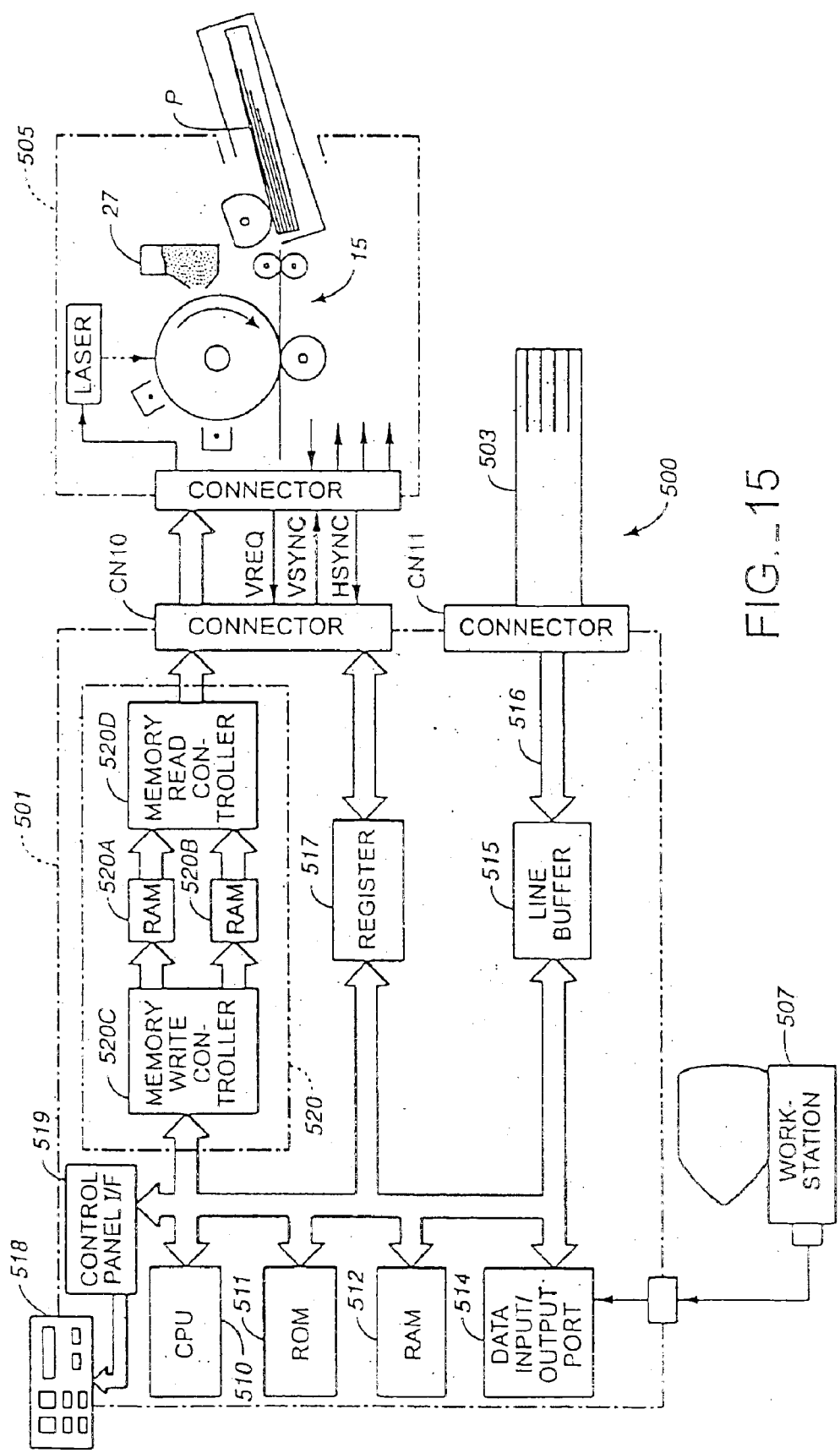
FIG. 15 illustrates a block diagram of the overall structure of a printer with a cartridge installed.

Exemplary embodiments of the present invention are disclosed in relation to: the physical structure and components used; electromagnetic noise test results; alternative cartridge embodiments; overall printer and cartridge combination structure, and certain other aspects of applications of the invention.

The invention is disclosed and embodiments described along with related background and implementation material in relation to the following general outline.

I. Cartridge Structure
  A. Physical Structure
  B. Electromagnetic Noise Test Results
  C. Alternative Cartridge Embodiments
II. Electrical Configuration of Printer and Cartridge
  A. Overall Configuration
  B. Cartridge Address Space
  C. Internal Cartridge Structure
  D. Data Transfer Controller
  E. Registers
  F. Read Control Circuit Configuration and Operation
  G. FIFO Control Circuit Configuration and Operation
  H. Double-Bank Control Circuit Structure and Operation
  I. Image Data Printing
III. Miscellaneous Aspects of the Invention Each section teaches certain aspects of the invention and its useful application to the laser printer art. In addition, the description is followed by an Appendix A which lists the numerals used in the figures along with corresponding element descriptions.

I. Cartridge Structure

A. Physical Structure

The present invention provides a method and apparatus for minimizing electrical noise or interference caused by the transfer of electromagnetic radiation from add-on data processing devices such as expansion cartridges for laser printers. The add-on device or cartridge uses a housing or casing designed to provide substantially complete electromagnetic shielding and eliminate direct transfer paths to the cartridge exterior for any radiation generated within the cartridge.

A perspective view of one embodiment of a printer-cartridge-type of add-on electronic device which is constructed and operating according to the present invention is illustrated in FIG. 1. An exploded perspective view of this cartridge is then illustrated in FIG. 2. The cartridge (503) illustrated in FIG. 1 is designed for insertion into an expansion slot of the type commonly found on many laser printers for adding font capabilities. However, as discussed further below and in the co-pending patent applications listed above, the inventive cartridge is also able to receive print data from the printer, process and develop the received data into image data, and provide the results back to the printer for producing an output image.

In FIG. 2, a cartridge 503 is shown having a multi-layer printed circuit board 550, called printed circuit board below, mounted inside of a generally upside-down U-shaped upper casing, shell, or housing 100 which has a recessed edge and a mating, plate-like, lower casing, shell, or housing 120. A cap or end cover composed of a lower cap 140 and an upper cap 150, is mounted on one side, or end, of the cartridge adjacent to a connector end of printed circuit board 550. A heat generating circuit element, component, or device, such as a microprocessor 601, is shown installed on printed circuit board 550. The cartridge end where caps 140 and 150 are located is referred to as the front of the cartridge and the opposite end of the cartridge, where the microprocessor 601 is positioned, is referred to as the rear of the cartridge.

Upper case 100, lower cap 140, and upper cap 150 are typically made from a lightweight, easily manipulated material such as, but not limited to, ABS resin. Manufacturing the cartridge casings from non-metallic material provides a low cost advantage for providing a less expensive case, and making it lighter in weight and easier to transport or carry. Lower case 120 is typically manufactured from a lightweight metallic material such as aluminum. Aluminum is preferred because it has a high thermal conductance rate and is very effective at conducting heat to the outside of the cartridge.

A conductive layer is formed on the inside surface of upper case 100, which together with lower case 120 constitutes a frame ground. An exemplary conductive or metallic material for the conductive layer on upper case 100 is electrodeless copper-nickel plating. In the alternative, the conductive layer can also be formed by using vacuum deposition of a conductive coating material, such as aluminum, or by applying a conductive paint or other liquid based coating material containing metal or conductive material. Alternatively, upper case 100 can be manufactured from a conductive plastic material which does not require a conductive coating.

An insertion plug 551 is formed on a top or bottom surface of the front end of printed circuit board 550, and consists of a series of electrodes or contacts arranged in parallel on surfaces of the board for contacting matching electrical contacts inside the printer cartridge slot. The number of contacts is determined by the corresponding size of a matching connector conventionally provided in the printer. Plug section 551 may also employ orientation slots or guides, if also used in the printer.

In this embodiment, microprocessor 601 and other circuit elements are shown installed toward the rear of printed circuit board 550, or the end opposite insertion plug 551. Microprocessor 601 is typically secured in this location by soldering processor connection pins 601p to contact pads on printed circuit board 550 after insertion through contact/mounting holes or vias. However, it is contemplated that other mounting techniques may be employed such as surface mounting technology or, where space permits, a socket assembly could be provided. Four springs 104 are secured to outer edges of printed circuit board 550. Two of the springs 104 are mounted near the center of the board and have spring leafs oriented substantially parallel to the direction of insertion for the cartridge. The other two springs are mounted at or near the rear of cartridge 503. Springs 104 are used to electrically connect ground potential conductors, traces, or wiring on printed circuit board 550 and the conductive layer on the inside surface of upper case 100.

Two grounding springs 122 are shown mounted toward the front of lower case 120 for obtaining grounding contact or a ground connection with a frame of the printer or other receiving electronic apparatus. Springs 122 are typically secured in place by fasteners such as rivets 123. Springs 122 have a shape that approximates a bird with its wings spread. First curved extensions or components 122a, which would correspond to right and left wings, each arch upward from the edges of a main spring body, while a second curved extension 122b, corresponding to a bird's feet, extends downward from the main spring body in the shape of a semicircular arc. First curved extensions 122a act to electrically connect lower case 120 with ground or fixed potential conductors on printed circuit board 550. Second curved extension or component 122b protrudes through generally rectangular openings 132 formed in lower case 120 and extends outside of cartridge 503. At least one of the two, or more, spring extension 122b makes electrical contact with a conductive frame within the printer adjacent to the cartridge, and electrically connects lower case 120 with a grounding element of the printer to provide an adequate ground for cartridge 503.

A wall-shaped mating member 124 is provided around the periphery of lower case 120 which extends upward from plate member 121. Mating member 124 mates with the sides of upper case 100 by fitting inside of the walls of upper case 100 and completes the nearly rectangular case structure.

In order to exert an upward bias to, or bending force on, printed circuit board 550, a resilient or compressible bias element 126 is placed on a bias retainer 128 on an inner surface at the rear of lower case 120. Bias element or piece 126 is typically formed from a cylindrically shaped compressible, elastic, or resilient material such as silicon rubber and presses against printed circuit board 550 in an area directly beneath microprocessor 601 to push this area, and, thus, microprocessor 601 upward. However, those skilled in the art will recognize that other compressible or elastic materials may be used for this bias (pressure) function.

A sheet of heat dissipating material 102, such as a piece of silicon rubber, is disposed between an upper surface of microprocessor 601 and an inner surface of upper case 100 to improve the closeness of fit or thermal contact between these elements and, therefore, the corresponding thermal conductance. Material having good thermal conductance is used for manufacturing heat dissipating material 102. For example, Shin-etsu (trade name) silicon sheets manufactured by the Shin-etsu Polymer Company Limited, TC-CG type (trade name) silicon sheets manufactured by Shin-etsu Chemical Company Limited, and Sakon (trade name) manufactured by Fuji High Polymers may be useful materials. Each of these materials possess a relatively high thermal conductance rate of 1 W/m·K or more. Heat dissipating material 102 typically comprises silicon rubber but other materials may be used, as long as they effectively conduct heat.

Alternatively, materials that are initially in a non-solid state, such as viscous liquid, putty, or grease-like states, but harden when used, can also be used on the upper surface of microprocessor 601. An exemplary material is the RTV (trade name) rubber compound from Shin-etsu Kagaku Kogyo K.K. If such a non-solid material is used, good surface contact between microprocessor 601 and upper casing 100 is obtained using a small quantity or thickness of material. Therefore, even a, material with a relatively low thermal conductance rate provides adequate heat dissipation in this configuration.

A heat dissipation plate 110, made from thermally conductive material such as aluminum, is also mounted on lower case 120 so that it covers the top of microprocessor 601. As compressible bias element 126 pushes upward, on printed circuit board 550, microprocessor 601 is also pushed upward, increasing the surface contact pressure between microprocessor 601 and heat dissipating material 102, and between heat dissipating material 102 and heat dissipation plate 110. As a result, heat generated by microprocessor 601 is efficiently transferred to lower case 120 through heat dissipation plate 110 where it is dissipated to the surrounding environment.

During assembly, two springs 122 are first secured to lower case 120 and silicon rubber bias element 126 is mounted in retainer 128. Various circuit elements are mounted on printed circuit board 550 and the four springs 104 are inserted in their respectively prescribed holes and secured in place, typically by soldering. Printed circuit board 550 is then mounted on lower case 120, and the rear corners (microprocessor 601 side) are secured in place with screws. Heat dissipation plate 110 is also secured to the side of mating member 124 on lower case 120 using fasteners such as screws. Upper case 100 is then mated with lower case 120, and lower cap 140 is inserted. At this time, two projections or mounting tabs 141 extending from the back of lower cap 140 have through-holes that are inserted under corresponding holes in upper case 100. In this configuration, plug 551 extends through a narrow slot 142 formed in lower cap 140. Upper case 100 is secured in place, typically at three locations toward the front end, using screws 160. Finally, cartridge 503 is completed as shown in FIG. 1 by fitting upper cap 150 on upper case 100, which covers the screws 160 and an expansion memory slot 106.

One button lock 154 is provided on each side of upper cap 150. Springs 152 are disposed inside of the button locks and push button locks 154 toward an outer edge of the cartridge and upper cap 150. In the outer most position or extension of the button locks, tabs on the button locks interact with or engage retention elements formed on upper case 100 and lock upper cover 150 in place. When button locks 154 are manually pressed inward, the tabs on the button locks are released from the retention elements, releasing cover 150.

An IC card 200 is also shown in FIG. 2 which is used as an expansion memory device and employs multiple dynamic RAM elements. IC card 200 can be installed in cartridge 503 as required or desired to perform various tasks. When inserting IC card 200, upper cap 150 is first removed to gain access to an expansion card insertion slot 106 provided in upper case 100. IC card 200 is inserted through slot 106 into an IC card connector 210 mounted on printed circuit board 550. Whenever upper cap 150 is attached, cartridge 503 again appears as shown in FIG. 1. In this embodiment, an IC card is inserted by simply removing a small removable upper cap 150. Therefore, use of an IC card does not require disassembly of the upper and lower cases, thus simplifying memory expansion. Further, by disposing upper cap 150 at the front of cartridge 503, IC card 200 cannot be inserted or removed once cartridge 503 is inserted in main laser printer unit. This minimizes potential for damage and task interruption, caused by improper removal or insertion of the IC card.

An enlarged perspective view of printed circuit board 550 is shown in FIG. 3. In FIG. 3, microprocessor 601 is shown as being attached toward the rear of an upper surface of printed circuit board 550, and insertion plug 551 is formed at other end.

A series of ROMs 606, 607, 608, and 609, are shown positioned near microprocessor 601 generally along the edges or sides of printed circuit board 550. These ROMs are used to store one or more control programs, etc., for execution by microprocessor 601. Four address buffers 617 are also shown mounted adjacent to microprocessor 601 in a square configuration in the center of printed circuit board 550. Two clock oscillators 661 and 665 form the basic timing elements for microprocessor 601 and other components and are disposed along one edge. IC card connector 210 is positioned between tri-state buffers 617 and plug section 551, offset slightly from board center. ASIC (application specific LSI) devices, which include control circuits, registers, etc., and ROM for storing processing programs for use by the printer (main printer ROM), and other circuit elements are mounted on the underside of printed circuit board 550. For clarity in illustration, any wiring or interconnect patterns present on the top and bottom surfaces of printed circuit board 550 have been omitted. For all of the circuit elements or components described above, the specific configurations, whether parallel, grouped, or irregular, are for purposes of illustration, and are not intended as a limitation inasmuch as other configurations are also contemplated within the teachings of the invention.

Due to its complexity and the interconnection density, microprocessor 601 is typically manufactured or packaged as a pin grid array (PGA) type of device. However, those skilled in the art will readily understand that other package types such as the SOJ, SOP, and QFP (Quad Flat Pack) styles can be employed as desired within the teachings of the invention. An exemplary microprocessor 601 is the Am29030, with a typical operating clock speed of 25 MHz, which is a RISC type microprocessor manufactured by Advanced Micro Devices (referred to as AMD).

As stated above, cartridge 503, is configured to be inserted into a cartridge slot otherwise used for providing printer font information. Common font cartridges merely hold a ROM, or ROMs, in which font data is stored and then used to recreate the font "style" for given text. In contrast, cartridge 503, contains control circuitry in the form of microprocessor 601, ROMs 606 through 609, ROM 618, and some ASIC-type circuitry which provide programmed processing functions for print data.

The printer connector into which cartridge 503 is inserted is configured according to predefined font cartridge connection specifications. According to these specifications, the printer receptacle or connector is provided with read only lines, in the form of an address bus, for reading data from the cartridge into the printer, but no signal lines for transferring data from the printer to the cartridge. However, the cartridge used for this embodiment of the invention also provides the ability to receive print data from the printer, develop it into image data using microprocessor 601 and associated circuitry, and return the processed data to the printer. Therefore, it is necessary to transfer print data from the printer to the cartridge using the read only lines in the connector. As a result, special processing is required by the printer microprocessor.

When cartridge 503 is inserted into the font cartridge or expansion slot of the printer, the processor inside the printer reads identification data stored in ROM 618 during printer or software initialization, or when power is applied to the printer. At this point ROM 618 exerts control over printer data processing within the printer. In response to the identification data, the printer processor begins processing image data according to processing programs or algorithms stored in and provided by ROM 618. That is, the printer processor executes special processing according to the programs stored in ROM 618. This special processing consists of generating addresses or address values that essentially contain one byte of print data (in the form of a PDL program), placing this address on the address bus, and communicating or transferring this address to cartridge 503 through the connector and plug 551. ASIC elements in the cartridge receive this address and extract the one byte of print data contained or encoded in the address by deciphering and storing it in RAM, as described later. One page of print data is then retrieved from RAM by microprocessor 601 and processed according to a desired PDL program and developed into image data. In this manner, developed image data are transferred from cartridge 503 to the printer and an image is printed by a xerography unit.

It is readily understood that it is better to use a processor that operates at speeds reasonably faster than the printer processor for microprocessor 601. The higher speed allows microprocessor 601 to receive and process data and provide image data back to the printer in less time than the printer processor could process the same data. At the same time, the printer is not substantially delayed or having to wait for data. This allows image development processing that must usually be executed by the printer to take place using a higher-speed microprocessor 601 and in essence have the net or effective processing speed of the printer increased. The circuitry inside of cartridge 503, and its operation, is also described in detail in the co-pending patent applications referenced above.

A plan view of lower case 120 is shown in FIG. 4A and a cross section in a plane parallel to line 4B—4B is shown in FIG. 4B. However, a cross section of upper case 100 is also included within the illustration of FIG. 4B. As shown in FIG. 4A, lower case 120 mainly consists of a plate 121 and wall-like mating element 124. Mating element 124 forms a substantially continuous wall around lower case 120 except for the area around screw holes 125 at the front end of the cartridge. As shown in FIG. 4B, mating member 124 mates with an inner surface of the sides of upper case 100 so as to form a case with a nearly rectangular cross section. As mentioned above, lower case 120 is generally made from aluminum or other conductive material and a conductive layer is formed on the inside surface of upper case 100. Therefore, conductive layers on the outer surface of mating element 124 and inside surface of upper case 100 overlap each other, which effectively prevents electromagnetic radiation generated by internal cartridge circuit elements from escaping the interior cartridge volume.

A bottom view of printed circuit board 550 (surface opposite surface on which microprocessor 601 is mounted) is shown in FIG. 5. For purposes of clarity in illustration, no circuit elements are shown mounted in FIG. 5. Multiple ground (or other fixed) potential (GND) contact pads 560, 562, 564, and 566 are formed around the outside edge of printed circuit board 550. These pads are portions or areas of, or are connected to, a conductive layer provided for use as signal ground on printed circuit board 550.

As can be seen from a comparison with FIG. 2, two ground pads 560 disposed near the rear of printed circuit board 550 (top of FIG. 5) are formed in areas that include through-holes in circuit board 550 for screws used to secure the printed circuit board to lower case 120. These pads are also formed with mounting holes, here three, for insertion of mounting prongs for springs 104, which electrically connects each spring to the corresponding pad. Two ground pads 562 disposed near the middle of printed circuit board 550 are also formed in with additional mounting holes in circuit board 550, again three, for mounting more springs 104. Two ground pads 564 located near or along the front end of printed circuit board 550, and a ground pad 566 located in the middle between pads 564, are formed with through-holes for screws 160 used to secure printed circuit board 550 to lower case 120.

When cartridge 503 is assembled, ground pads 560 and 562 are electrically connected to the conductive layer on the inside surface of upper case 100 through spring members 104. At the same time, ground pads 560, 564, and 566 are electrically connected to lower case 120 by contact screws extending through screw holes in lower case 120. As a result, the ground conductor (signal ground or SG below) of printed circuit board 550 is connected to the conductive layer (frame ground or FG below) of the case at multiple locations. By connecting SG and FG at multiple locations, the impedance between SG and FG can be reduced and the generation of high frequency eddy or parasitic currents prevented. This in turn prevents generation of extraneous electromagnetic radiation (electrical noise).

As shown in FIG. 2, since the conductive layer does not extend around through-hole 142 in lower cap 140, electromagnetic radiation can escape or exit from the cartridge in this region. As is well known in the art, there are various national or international standards established for acceptable levels of electromagnetic radiation and noise or interference. These standards are enforced by governmental departments or agencies such as the Federal Communications Commission (FCC) in the United States, VCCI in Japan, etc. The regulations used by these agencies typically prescribes a frequency range of between 30 to 1,000 MHz as delimiting undesirable noise signals. Therefore, if electromagnetic radiation in this frequency range can be reduced, harmful noise or interference, as defined, can be prevented. From this standpoint, ground pad 566 near the middle of plug 551 (FIG. 5) is provided to reduce undesirable noise by decreasing the wavelength of the electromagnetic radiation emitted from through-hole 142. In this embodiment, the wavelength is decreased by approximately a factor of two (i.e., approximately doubling the frequency).

A side view of circuit board 550 is shown in FIGS. 6A and 6B for use in detailing the electrical connection of printed circuit board 550 and lower case 120 using springs 122. Printed circuit board 550 is shown in FIGS. 6A and 6B as before and after being placed on lower case 120, respectively. As shown in FIG. 6A, there is a gap between first curved member 122a of spring 122 and mating member 124 of lower case 120. In FIG. 6B, first curved member 122a presses against printed circuit board 550, but there is still a small gap between mating member 124 and curved member 122a. Since the end of curved member 122a is divided into three parts, each of which functions separately as a spring member, spring 122 and the ground conductor on the bottom surface of printed circuit board 550 are reliably electrically connected. Springs 122 also act to prevent generation of electromagnetic noise.

First curved spring members 122a may be connected to conductors having potentials other than ground. That is, they may also be used to electrically connect power source wiring supplying regulated voltage (such as 3 V, 5 V, etc.) for driving microprocessor 601 and other peripheral circuits, to lower case 120. These elements may also be connected to power source wiring for regulated or stabilized voltages provided by separate power source wiring.

An enlarged cross section of the mounting area for microprocessor 601 on circuit board 550 of FIG. 5 is shown in FIG. 7. In FIG. 7, compressible material 126 is shown positioned in a retaining section 128 of lower case 120. A heat dissipating material 102 is mounted between the upper surface of microprocessor 601 and heat dissipation plate 110. The compressible material presses or biases printed circuit board 550 upward under microprocessor 601 which is shown attached on top of printed circuit board 550. This creates good thermal contact between microprocessor 601, heat dissipation material 102, and heat dissipation plate 110, and improves heat dissipation across these elements. Heat generated by microprocessor 601 is discharged through material 102, heat dissipation plate 110, and lower case 120, where it is discharged to the surrounding air.

In addition, as shown in FIG. 7, a number of passages or holes are formed in end surface 108 of upper case 100 to make a surface structure through which air easily passes. Therefore, these holes are also effective in dissipating heat from inside of cartridge 503 to the outside. Using or forming several air passages in edge surface 108 effectively increases the surface area, which also improves heat dissipation. However, when other heat dissipation measures are deemed adequate, it is not necessary to provide openings in edge surface 108. Further, it is better not to open holes in end surface 108 when trying to reduce electromagnetic noise.

Perspective views of cartridge 503 after insertion into a first type of printer 1A and a second type of printer 1B are illustrated in FIGS. 8 and 9, respectively. Longitudinal cross sections of inserted cartridge 503 in relation to frames 180 and 182 of printers 1A and 1B, are then shown in FIGS. 10 and 11, respectively. However, in FIGS. 10 and 11, the circuit elements, etc., and the cross hatching normally used to illustrate a cross section, are omitted for purposes of clarity in illustration.

As shown in FIG. 10, plug 551 of printed circuit board 550 has been inserted into an interface connector CN11 or printer 1A. In this position, at least one spring component 122 at the rear, or non-connector end, of cartridge 503 makes electrical, and thermal, contact with metal frame 180 of printer 1A. As shown in FIG. 11, at least one spring component 122 at the front, or connector end, of cartridge 503 makes electrical, and thermal, contact with metal frame 182 of printer 1B. This means that one of the two spring members 122 comes into contact with a grounded portion of the main printer unit and the cartridge case and the printer are reliably electrically connected.

Therefore, as described above, several anti-noise countermeasures are implemented for inhibiting the generation of electromagnetic noise or interference from or by the cartridge. These measures can be summarized as:

(1) Forming a conductive layer on inside surfaces of plastic upper case 100, while manufacturing the lower case from a metal such as aluminum so that a conductive layer or barrier is formed over the entire interior of the cartridge case to effectively block transmission of electromagnetic radiation to the outside of the cartridge.

(2) A wall-like mating member 124 is provided around the periphery of lower case 120 which fits inside of upper case 100. This results in conductive layers on the outer surface of mating member 124 and inside surface of upper case 100 overlapping to effectively block transmission of electromagnetic radiation to the exterior of the cartridge.

(3) Signal and frame grounds are connected at multiple locations to decrease any impedance between them, and to suppress the generation of high frequency eddy or stray currents.

(4) Signal and frame grounds are connected both on the sides and middle of plug 551 near through-hole 142, to reduce the wavelength of electromagnetic radiation that can be emitted from through-hole 142 (frequency is increased). This reduces electromagnetic noise in the wavelength band of interest that is typically the subject of regulations relating to electrical noise or interference.

These countermeasures are also followed by implementing two more general countermeasures in cartridge 503.

(5) A decoupling capacitor is provided near the ground terminal or pin of each of the circuit elements and the power source terminal.

(6) A common mode choke coil is provided in series with the power source conductor for microprocessor 601.

B. Electromagnetic Noise Test Results

A graph representing measurements of electromagnetic noise for the cartridge taken before electromagnetic noise countermeasures were implemented is shown in FIG. 12A. Another graph of these measurements taken after implementing an embodiment of the invention is shown in FIG. 12B. In FIGS. 12A and 12B, the single-dot dashed line indicates an FCC guideline or acceptable electromagnetic noise standard. The countermeasures, designated as items (2) through (6) above, were not implemented in the cartridge before the first countermeasure was taken, and both upper case 100 and lower case 120 were made from aluminum. As can be seen from FIGS. 12A and 12B, the above countermeasures reduce measured electromagnetic noise considerably, and after such countermeasures are taken the cartridge sufficiently satisfies typical governmental regulations, such as those promulgated by the FCC.

C. Alternate Cartridge Embodiments

To prevent theft of the cartridge, the cartridge and main printer unit can be mechanically connected. FIG. 13 shows cartridge 503 and printer 1 connected by a chain 570. A hole or reinforced passage 572 is formed in the end of cartridge 503 that remains to the exterior of the printer, and a ring 573 is passed or inserted through hole 572 and secured in place. One end of chain 570 is attached to the ring, and the other end is secured with a screw or similar fastener to printer 1. Here the chain is illustrated as being secured to a ground terminal 574 of the printer for convenience, and to prevent the chain from acting as a radiating element for electromagnetic radiation.

In the alternative, a lock mechanism can be employed as illustrated in FIG. 14. In FIG. 14, a cartridge 503 is shown using a keyed lock mechanism 580. When a key is inserted in mechanism 580 and turned, a protruding element 582 contained inside cartridge 503 is extended inside of printer 1 and engages a groove or depression (not shown) at a corresponding position in the printer. The lock pin could also be extended to engage any portion of the frame surrounding the slot in which cartridge 503 is inserted. Using this approach, cartridge 503 is prevented from being removed from the printer. Those skilled in the art will appreciate that key lock mechanism 580 can also be configured to provide an electrical switching function so that turning the key not only locks cartridge 503, but also switches or engages a power source for the cartridge. Instead of a chain or lock mechanism, cartridge 503 can also be secured to the printer with a screw to prevent theft.

While an IC card was used as an expansion memory device in the above embodiment, SIMMs (single in-line memory module) or other types of portable expansion memory elements can also be employed as desired within the teachings of the present invention.

II. The Electrical Configuration of the Printer and Cartridge

A. Overall Configuration

A general block diagram of a laser printer 500, in which cartridge 503 is used is illustrated in FIG. 15. In FIG. 15, laser printer 500 is shown being equipped with an electronic control device, unit, or circuit 501, which controls all of the operations of laser printer 500, and a laser engine 505 which forms an output image on paper or other transfer media P. Laser printer 500 is shown as being connected to a computer or work station 507 as a source of print data. Electronic control circuit 501 generates or develops image data, in the form of bit-mapped data, from the print data provided by, or transferred from, work station 507. The image or developed image data is transferred from controller 501 to laser engine 505 through a connector CN10 where a xerography unit 15 responds to the data and forms an output image on paper P.

As shown in FIG. 15, electronic control circuit 501 is equipped with a commonly known microprocessor or central processing unit (CPU) 510, here chosen to be a MC68000 processor which is manufactured by Motorola. Control circuit 501 also employs a ROM 511 for storing programs for execution by the printer CPU; a RAM 512 for storing post developed print and image data; a data input/output port 514 for receiving print data from work station 507; a line buffer 515 attached to a bus line 516 for transferring data exchanged with cartridge 503; a register 517 for exchanging command and status data with laser engine 505; a console panel interface I/F 519 for providing interface control between laser printer 500 and a console panel 518; and a double buffer circuit 520 for retaining image data sent to laser engine 505.

As seen in FIG. 15, an exemplary double buffer circuit 520 makes use of two RAMs, RAM 520A and RAM 520B, which each typically accommodate up to eight lines of print data for laser engine 505, which corresponds to 4 kilobytes of memory capacity. A memory write controller 520C is used to alternately write image data to one of these RAMs from CPU 510. A memory read controller 520D alternately reads data from each of the two RAMs, 520A and 520B, and transfers that data to laser engine 505 where it is converted into video signals synchronized with the timing of the rotation of the photosensitive drum in order to print data. Two RAMs 520A and 520B are provided, and reading and writing of data takes place alternately, because CPU 510 and laser engine 505 are configured to access memory, these RAMs, independently.

After CPU 510 writes data to one of the RAMs, it sets a flag in a specific bit position of register 517 to show the presence of new data. Laser engine 505 then checks this flag and responds by reading image data stored in the RAM from the appropriate addresses to which it was written. During the reading process, another bit in register 517 is set to inform CPU 510 which RAM is being read to prevent access before the reading operation is terminated. Since only one RAM is being accessed by laser engine 505 at this time, CPU 510 writes the next eight lines of image data to the other RAM during this period. After the process of reading data from one RAM is complete, laser engine 505 resets the appropriate flag bit and proceeds to read data from the other RAM. The speed at which CPU 510 writes data is faster than the speed at which laser engine 505 reads data, that is, the print execution speed. Therefore, a memory access conflict between the two is generally automatically avoided and the transfer of one page of image data takes place simply and efficiently.

As stated, cartridge 503 is connected to control circuit 501 through connector CN11. A line buffer 515, which has a bus driver (not illustrated) mounted somewhere along data bus 516, acts as a one-way buffer that transfers data from connector CN11 to CPU 510. In other words, when viewed from the processing perspective of CPU 510, cartridge 503 is a read only device.

When power is turned on or applied to printer 500, electronic control unit or circuit 501 determines if a cartridge 503 is connected to connector CN11. If a cartridge is detected, an internal reset for control circuit 501 is activated. After being reset or performing initialization etc., control circuit 501 executes a jump to a pre-specified address of a ROM provided in cartridge 503 (discussed later). Subsequent to this jump, control circuit 501 sequentially executes processing steps provided by cartridge 503. Meanwhile, cartridge 503 interprets the PDL data output to laser printer 500 from work station 507, develops it into image data, and provides program steps to control circuit 501 so that the appropriate printing occurs using laser engine 505.

The wiring relationship of plug 551, formed on one end of printed circuit board 550, and connector CN11 is shown in FIG. 16. As shown in FIG. 16, plug 551 employs 25 pins on either side (sides A and B) of two sided printed circuit board 550. In FIG. 16, a signal name is used to label each corresponding pin of plug 551. A slash mark [/] affixed to a signal name indicates that the signal is active low [logical 0].

In FIG. 16, /ASB represents an address strobe signal (ASB) transmitted by CPU 510 within the printer (here a Motorola MC68000), while /UDS and /LDS represent upper and lower data strobe signals output by CPU 510. An auxiliary address strobe (ADS) or /ADS signal is an assist signal generated as a result of certain parameters and the status of address strobe signal /ASB in electronic control circuit 501. The /ADS signal provides an indication of activity when the printer starts up or is initialized, which is different for different printers. As discussed later, in this embodiment, the printer type is determined according to activity or operation that takes place when the /ADS signal is initialized.

An output data acknowledge signal or /ODTACK signal is shown which is transferred from cartridge 503 to control circuit 501. A cartridge select or /CTRGSEL signal represents a signal used by CPU 510 to select cartridge 503 and access ROM, registers, etc., that are allocated to internal address spaces. Addresses or address signals A1 through A20, and read and write signal R/W, are both output by CPU 510, while signals D0 through D15 are provided by cartridge 503. A clock or SCLK signal is output by an oscillator (not illustrated) built into laser printer 500.

A cartridge registration or detection or /CTRGS signal is provided in laser printer 500 which is pulled down or low when cartridge 503 is inserted. As a result, CPU 510 detects the presence of cartridge 503 when inserted into connector CN11.

CPU 510 typically uses 23-bit address signals for signals A1 through A23 to specify an address word and the /UDS and /LDS signals to specify high (upper) and low (lower) end bytes, respectively, of each word. As a result, CPU 510 is able to handle 16 megabytes of address space, generally residing at address values ranging from 000000h to FFFFFFh. Here the symbol 'h' that is attached to the end of the address indicates a hexadecimal number or unit.

B. Cartridge Address Space

Cartridge 503 is allocated some of the address space, specific address range, accommodated by CPU 510 in control circuit 501. CPU 510 uses addresses within a range or space bounded by the values 000000h and FFFFFFh, for a 16-megabyte address space, but part of this address range is already allocated for use by ROM. The space allocated to cartridge 503 changes depending on the specific model or type of the laser printer. In the case of Hewlett-Packard laser printers, a 2-megabyte memory capacity or address space allocation for address values ranging from say 200000h to 3FFFFFh or from 400000h to 5FFFFFh is assigned, as shown on the left side of FIG. 17.

However, as previously discussed, the typical microprocessor 601 used in cartridge 503 is an AMD model AMD29030—25 MHz which can handle 4 gigabytes of memory at address values ranging from 00000000h to FFFFFFFFh. In addition to ROM and RAM allocations within this address space, allocation occurs for various registers used for data exchange with electronic control circuit 501. This type of allocation is illustrated in FIG. 18. The configuration of components inside of cartridge 503 is described below along with address space requirements for both microprocessors used within the combined cartridge and printer system.

C. Internal Cartridge Configuration

The internal configuration of cartridge 503 is shown in FIG. 19. In FIG. 19, cartridge 503 is configured with a centrally located microprocessor 601 for controlling all cartridge operations. The cartridge is also shown using a memory section 602 with ROM, RAM, and support circuitry, a data transfer controller 603 to control data exchange with control circuit 501, and some additional circuitry.

Memory section 602 employs a series of ROMs 606 through 609, which generally aggregate to a total memory capacity of 2 megabytes, and are used to store programs for microprocessor 601 execution. A selector 610 is used to provide bank switching of ROMs 606 through 609. RAMs 611 through 614, also provide a total memory capacity of at least 2 megabytes, and are used to retain print data received from control circuit 501 and to also retain post developed image data. ROMs 606 through 609 are generally configured as mask ROMs, each having 16 bits by 256 kilobits of capacity, for a total of 4 megabits of memory. As shown in FIG. 18, ROMs 606 to 609 are allocated to address spaces 00000000h to 1FFFFFh. Each ROM set 606, 607, and 608, 609 forms a 2-unit bank creating a 32-bit data bus. ROMs 606 and 609 and microprocessor 601 are connected by address bus AAB and a control signal bus. Data bus IDB of each of ROMs 606 to 609 is also connected to data bus DB29 through data selector 610. Therefore, microprocessor 601 is able to read data from ROMs 606 through 609. All address signals, except the three low end bits (A0, A1, and A2) from microprocessor 601 on address bus AAB, are input to ROMs 606 and 607, and ROMs 608 and 609.

The two low end bits (A0 and A1) are not input because data is read by microprocessor 601 in units of one word, or thirty-two bits (4 byte units). In addition, if the third lowest address bit A2 is not used when reading data, ROMs 606 to 609 output data simultaneously, and data selector 610 makes adjustments to data being output from the ROMs simultaneously. That is, the access of the ROMs by microprocessor 601 often takes place from consecutive addresses. Therefore, using 32-bit data words, consecutive words are read from ROMs 606 through 609. If consecutive words are actually read, the two-set ROM banks are switched in sequence by data selector 610 and the data is read consecutively. As a result, reading two consecutive words or contiguous data is extremely fast.

RAMs 611 through 614 are each generally implemented as 16 by 256 kilobit DRAMs, for a capacity of 4 megabits. As shown in FIG. 18, these RAMs are allocated to 2 megabytes of address space or addresses from 20000000h to 201FFFFFh. An additional 2 megabytes of memory can be added to cartridge 503 using expansion RAM interface 615 which is allocated to addresses from 20200000h to 203FFFFFh. Typically, a maximum of 2 megabytes of SIMM type RAM can be installed in expansion RAM interface 615. RAMs 611 through 614 and expansion RAM 615 data lines are connected directly to a data bus DB29, which is the microprocessor 601 data bus. The RAM address lines are connected to microprocessor 601 address bus AAB through a data transfer controller 603. Register I/O, discussed later, is allocated to address spaces starting from 80000000h.

Returning to FIG. 17, when viewed from the perspective of control circuit 501, cartridge 503 ROM is allocated to the first 128 kilobytes. That is, cartridge 503 contains programs that are to be executed by CPU 510. When cartridge 503 is inserted or otherwise installed, CPU 510 executes a jump instruction to the address specified for this ROM after initialization is completed, and CPU 510 subsequently operates according to processing steps stored in this ROM.

When CPU 510 accesses the first 128 kilobytes of the 2 megabyte space allocated to cartridge 503, ROM 618 is accessed using an address signal output through address buffer 617 provided for connector side address bus CAB of cartridge 503. The commands and data stored in ROM 618 are sent to CPU 510 through data buffer 619 formed on data bus CDB of the connector. The 'X' used in labeling the FIFO (lower right) addresses in FIG. 17 represents the four high end bits of the first address of the allocated address spaces.

D. Data Transfer Controller

A variety of control and status registers are accessed at addresses other than those addresses allocated to ROMs and RAMs in the address maps shown in FIGS. 17 and 18, and are provided for data transfer controller 603, which is described next. The controller description chiefly relates to circuitry with further reference to address maps (FIGS. 17 and 18) as appropriate.

Data transfer controller 603, shown in FIG. 19, is formed using an ASIC having around 7,900 usable gates. An exemplary ASIC found useful in manufacturing the invention is manufactured by Seiko Epson, and is a standard cell device, model number SSC 3630, which exhibits low power consumption and is manufactured using a CMOS process. Data transfer controller 603 controls the exchange of data between control circuit 501 and microprocessor 601 of cartridge 503. This data exchange uses a read control circuit 620 to send data through a read only data bus from control circuit 501 to cartridge 503; a FIFO control circuit 623 to pass data through a FIFO memory 621, using read control circuit 620; and a double bank control circuit 624, which makes it possible for control circuit 501 to read data from cartridge 503. FIFO memory 621 is configured as a RAM-type memory device that sequentially stores and reads data using a first-in-first-out procedure. An exemplary component useful for implementing this RAM is a RAM circuit, part number M66252FP, manufactured by Mitsubishi Electric.

Address bus CAB is connected to data transfer controller 603 through address buffer 617, and data bus CDB is connected through data buffer 619. A first decoder 631, formed in controller 603, receives address bus CAB and cartridge selector CSEL signals and outputs selection signals to other elements in data transfer controller 603. In a similar manner, address bus AAB and control signal CCC, from microprocessor 601, are connected to transfer controller 603 using a bus controller 635 formed in controller 603. A second decoder 632 is connected to address bus AAB and outputs selection signals to other data transfer controller 603 circuitry. Furthermore, bus controller 635 outputs address signals and control signals to ROMs 606 through 609 and RAMs 611 through 614, as well as expansion RAM interface 615.

In addition to the above elements, a variety of other registers are provided within data transfer controller 603. Beside normal read and write operations, many other registers are automatically written to when special processing takes place. The configuration of these special registers is described below.

Taken from the control circuit 501 point of view, cartridge 503 is a read only device, and registers writable from control circuit 501 are configured to be written to using a read operation from a specified address. That is, by specifying a particular address, a selection signal is output from a first decoder 631 and data is written to a certain register as a result. Reading from the registers takes place using normal read cycle operations. Data reading and writing by microprocessor 601 also occurs using normal read and write operations. In FIG. 19, registers are shown as being connected to a readable bus, and write operations are simply indicated by arrows. Such registers include, interrupt request register 640, polling command register 643, status register 645 (FIG. 17 register STATUS), transfer flag register 647 (FIG. 18 register BPOLL), PROM control register 649, and control register 650.

Among these registers, registers other than status register 645 and transfer flag register 647 represent a generic name for multiple registers allocated as memory mapped I/O for CPU 510 or microprocessor 601 and are not necessarily allocated to consecutive addresses. Registers AMDINT0, AMDINT1, and AMDINT2, and registers AMDCLR0, AMDCLR1, and AMDCLR2, shown in FIGS. 17 and 18, belong to interrupt register 640. Registers POLL and MCONTCS belong to polling command register 643. The PROM control registers include the registers EEPCS, EEPSK, and EEPDI.

All registers not belonging to read control circuit 620, FIFO control circuit 623 or double bank control register 624, and not mentioned in the above description, generally belong to or form part of control register 650. These are registers ADDMUXA, ADDMUXB, CLKDIV, RTCVAL, RTCON, RTCSEL, RTCCLR and SYSKEEP, which are shown in FIGS. 17 and 18.

Among the various portions of FIGS. 17 and 18, EWWRL and EWWRH, which are each 512 bytes in size, are memory areas used for writing to a first latch 651 and a second latch 652 of read control circuit 620 from control circuit 501. Register EWRD is equivalent to seeing latches 651 and 652 as a one word latch from the microprocessor 601 point of view. Registers FIFOREQ, FIFORST, and FOFOW are equivalent to FIFO register 653 of FIFO control circuit 623. Registers FIRCLK, RDCLK, FIFORD, and RDRST are equivalent to FIFO read register 655 of FIFO control circuit 623. A latch 657 is also provided in FIFO control circuit 623 to maintain data to be written to FIFO memory 621 using some of the functions of read control circuit 620.

Portions of FIG. 17 labeled by the symbols DPRAMA and DPRAMB represent buffers having a 32 byte capacity. These buffers are equivalent to viewing first and second buffers 658 and 659 of double bank control circuit 624 from the control circuit 501 side. These banks, DPWROA and DPWROB, shown in FIG. 21, are what is seen by microprocessor 601 when viewing buffers 658 and 659. Certain bits d1 and d2 of status register 645 are also used for the exchange of data through double bank control circuit 624. Details of this exchange are provided below.

E. Registers

Interrupt request register 604 is a register that generates, or transfers and retains an interrupt request from control circuit 501 to microprocessor 601. Three levels, and three corresponding registers (AMDINT0, AMDINT1, and AMDINT2), are provided for interrupt requests directed from control circuit 501 to microprocessor 601, as shown in FIG. 17. An interrupt request to microprocessor 601 is generated by control circuit 501 reading any of the individual registers forming interrupt request register 640 which sets these registers. However, data read during this operation has no meaning and is generally irrelevant to the generation of interrupt requests.

A more detailed example of configurations useful for implementing interrupt request register 640 is illustrated in FIGS. 20A, 20B, and 20C in which registers are formed using D-type flip-flops. An output pin, Q, for each D-type flip-flop, 640a, 640b, and 640c, is set active low using the AMDINT0, AMDINT1, and AMDINT2 signals, respectively, which are output by first decoder 631 during the register read operation described above. As before, the use of a "/" or slash symbol in front of a signal label indicates that the signal is active low.

As shown in FIG. 18, the corresponding registers that clear the respective outputs of flip-flops 640a, 640b, and 640c, are allocated to specific addresses as three read only registers AMDCLR0, AMDCLR1, and AMDCLR2, respectively. As a result, when a microprocessor 601 read operation from all of the addresses allocated to this register (640) takes place, a second decoder 632 outputs /INTCLR0, /INTCLR1, and /INTCLR2 signals and the corresponding flip-flops are preset.

When an interrupt originates from control circuit 501, one register in interrupt request register 640 must be accessed. Microprocessor 601 determines a priority and performs operations that apply to the interrupt request. In this case, microprocessor 601 clears the corresponding interrupt request registers 640a, 640b, and 640c.

Polling command register 643 is used to pass commands or instructions from microprocessor 601 to control circuit 501, and it can be written to by microprocessor 601 and read by control circuit 501. An exemplary hardware configuration for register 643 is shown in FIG. 21. As indicated in FIG. 21, command register 643 uses two octal D-type flip-flops, 643a and 643b, which form a 16-bit wide data latch, and one D-type flip-flop, 643c. A 16-bit wide data bus DB29 originating from microprocessor 601 is connected to data input terminals or pins 1D through 8D of flip-flops 643a and 643b, while a 16-bit data bus DB68 originating from control circuit 501 is connected to output terminals, 1Q through 8Q.

Second decoder 632 outputs a /MCONTCS signal when microprocessor 601 accesses polling command register 643 (FIG. 18, register MCONTCS), which is input to clock terminals CK of flip-flops 643a and 643b. When the leading edge of this signal goes low, the contents of data bus DB29 are latched to flip-flops 643a and 643b. In addition, first decoder 631 outputs a /POLL signal when control circuit 501 accesses polling command register 643 (FIG. 17, register POLL), which is connected to output-enable terminals OE, which enables the outputs of flip-flops 643a and 643b. When this signal goes low, data retained in flip-flops 643a and 643b is output to data bus DB68.

The /MCONTCS and /POLL signals are connected to a clock pin C and preset terminal PR of D-type flip-flop 643c. Flip-flop 643c generates a CMDRD signal on its output pin Q which is set high (logic 1) when DB29 data is latched in flip-flops 643a and 643b (/MCONTCS is low) and reset low (logic 0) when this data is read by control circuit 501 (/POLL is low). A read enabled status register 645 connected to control circuit 501 uses a specific bit d3 (also called flag CMDRD below) to determine the status of the CMDRD signal. Therefore, by reading status register 645, control circuit 501 is able to know, or is provided with an indication from microprocessor 601, that command code has been set in polling command register 643.

When control circuit 501 observes the CMDRD flag, bit d3 of status register 645, and finds that an instruction or command has been placed in register 643, it reads the contents of command register 643 during a normal read cycle. That is, it reads the command sent from microprocessor 601. The commands are, for instance, to start transferring print data to data transfer controller 603, to start printing, or to display messages on console 518. As shown in FIG. 21, when control circuit 501 reads the contents of polling register 643, CMDRD, output by flip-flop 643c, its output is then reset high using the /POLL signal. Therefore, by observing a bit d2 of transfer flag register 647, microprocessor 601 is able to know whether or not the command it output was read or received by control circuit 501.

In addition to the data described above, which shows whether or not a command has been placed in the register by microprocessor 601, status register 645 also retains the data illustrated in FIG. 22, which is described as follows. Bit d0 of this data is set low by the EWRDY signal, which is generated within read control circuit 620 when data is written there by control circuit 501, discussed later. When that data is read by microprocessor 601, bit d0 is set high by a signal from a second decoder 632. This bit is generally referred to as the EWRDY flag or flag EWRDY.

Data bits d1 and d2 indicate whether or not double bank control circuit 624 has its access enabled either by control circuit 501 or microprocessor 601. The respective flags are referred to as ADDMUXA and ADDMUXB. These two bits correspond to the two transfer banks built into double bank control circuit 624. As shown in FIG. 18, bits d1 and d2 are set and reset by microprocessor 601 when writing data to bit d0 of registers ADDMUXA and ADDMUXB, which are contained in control circuit 650. Therefore, before writing data to one of the banks of double bank control circuit 624, microprocessor 601 sets the flag to a low level and then resets it high after writing is finished. Assuming control circuit 501 reads data from the bank side in which this flag is set high (1), by alternately writing and reading the data to the two banks, microprocessor 601 connects to the control circuit 501 side and passes data. The function of the d3 bit (flag CMDRD) has already been described above.

Bit d5 acts as a flag CLKDIV, which is set according to the operation of the microprocessor 601 clock. Clock CLK, which is output from first oscillator 661 and typically employs an external liquid crystal vibrator CRC1, is used as the operating frequency for microprocessor 601. If a value of zero is written to bit d0 of a register CLKDIV of control register 650 from microprocessor 601, the microprocessor clock is set to operate at a predetermined frequency, here 25 MHz. However, if a one is written to bit d0, the clock is set to operate at one-half of this frequency, or 12.5 MHz in this example. Flag CLKDIV of status register 645, when observed from the point of view of control circuit 501, is set low when clock CLK is operating at a its normal frequency, of 25 MHz, and set high (1) when this is decreased, to 12.5 MHz. Control circuit 501 checks bit d5 in status register 645 to determine the clock frequency, that is, to know the current operating speed of microprocessor 601 in order to match the timing for data transfers, etc.

The d6 bit acts as a flag referred to as ADMON, which is set high when microprocessor 601 is processing data and set low when microprocessor 601 terminates data processing and enters a sleep mode. In the preferred embodiments, microprocessor 601 receives PDL-type data from control circuit 501 and then performs the processing necessary to develop this data into image data. However, if no PDL-type data is provided by control circuit 501, microprocessor 601 does not perform any data processing and is considered inactive. If this inactivity continues for a predetermined amount of time, microprocessor 601, through oscillator 661, is switched to a lower operating frequency to conserve power and decrease the amount of heat output. While those skilled in the art will recognize that several intermediate frequencies could be used, a preferred operating frequency for the initial sleep mode is one half of the initial operating frequency, that is, 12.5 megahertz in this example. If the inactivity extends for a significant period of time, microprocessor 601 ceases operation and enters a second sleep mode wherein the output of oscillator 663 is set to zero and microprocessor 601 is effectively turned off. When transitioning from the first to the second sleep state, or half frequency operation to off, microprocessor 601 writes a zero in register ADMON of control register 650. As a result, bit d6 of status register 645 is set low, and control circuit 501 can easily detect the current operating mode of microprocessor 601 by checking this bit.

A real time clock built into data transfer controller 603 is used to measure the amount of activity or inactivity of microprocessor 601. The clock signal provided by second oscillator 667 is used to operate a real time clock RCLK, and is typically operated using a liquid crystal vibrator 665. The real time clock is formed as part of bus controller 635 and uses instructions from microprocessor 601 to measure specific elapsed time intervals. As previously indicated, two independent oscillators 663, 667, along with two sets of liquid crystal vibrators 661, 665, are used to make microprocessor 601 clock CLK independent of, and, therefore, independently adjustable from, real time clock RCLK.

By making bit d1 of registers RTCVAL and RTCSEL, for control register 650, low or high (0 or 1), the real time clock is used to establish four different times or timers. When bit d0 of register RTCON is set to one, one timer is started. In starting this timer, an interrupt signal is output to microprocessor 601 for a pre-selected timing interval until a zero is written to bit d0 of register RTCON at which point this timer is stopped. When microprocessor 601 receives this interrupt request signal, it reads register RTCCLR and clears the interrupt request. The output of these interval timers are used for counting user time, etc., during PDL data processing.

The configuration of PROM in an exemplary control register 649 is described next. The three registers EEPCS, EEPSK, and EEPDI, shown in FIG. 18 are contained in PROM register 649 of FIG. 19. These registers are typically memory elements built into cartridge 503 which are used to exchange data with EEPROM 670, which is capable of being electrically erased and rewritten with data.

Cartridge 503 stores variables (configuration parameters) required for the operation of laser printer 500 in EEPROM 670 which performs reading, deletion, and rewriting of data using a serial transfer format. An EEPROM found useful in implementing the invention is an EPROM, part number NMC93C66X3, manufactured by National Semiconductor. EEPROM 670 has a memory capacity of around 16 bits by 256 bytes (number of registers) and is capable of reading, erasing or writing the contents of any specified register. When selected using a chip select signal CS, EEPROM 670 receives zero (0) and one (1) value binary data transferred to serial data input terminal $D_{in}$ in synchronization with the serial data clock SL. However, the first three data bits being transferred are interpreted as a command to the EEPROM, and the next eight bits are interpreted as a register number or location for reading, erasing, or writing data. When writing data to be stored, it is supplied to input terminal $D_{in}$ in synchronization with serial data clock SL following the command and register specifications.

Register EEPCS provides a signal that switches the level of the chip select signal. When microprocessor 601 writes a zero to bit d0 of this register, EEPROM 670 is selected. Register EEPSK is used to generate serial clock SK. Microprocessor 601 generates a serial data clock for use by EEPROM 670 by alternately writing zeros and ones to register EEPSK. Register EEPDI is used to retain each data bit that is written to EEPROM 670. When microprocessor 601 generates clock SK by rewriting register EEPSK, it simultaneously rewrites a bit d0 of register EEPDI based on the data to be rewritten. Data output terminal Dout of EEPROM 670 represents bit d0 of transfer flag register 647, which was previously described. After providing a data read command and identification of the register to be read to EEPROM 670, if microprocessor 601 reads bit d0 of transfer flag register 647 at the same time as the serial data clock, it reads the contents of the specified register. Since data stored in EEPROM 670 is retained even if power is turned off, the circuit or logic configuration present prior to power loss can be restored by reading the contents of EEPROM 670 immediately after power is restored to laser printer 500.

F. Read Control Circuit Configuration and Operation

An exemplary read control circuit 620 and associated data transfer steps utilized in its operation are described next. As shown in FIG. 23, read control circuit 620 uses two 8-bit latches, a first latch 651 and a second latch 652, a ROM 671 to output transferred data, a three-input AND gate 672, and a D-type flip-flop 674, which generates flag EWRDY (bit 0) of status register 645. Viewing read control circuit 620 from the point of view of control circuit 501, as shown in FIG. 17, latches 651 and 652 correspond to the two registers EWWRL and EWWRH, which transfer data in 8-bit units.

These registers are used to transfer the low end bytes (EWWRL) and high end bytes (EWWRH), respectively, of data in which each word is equal to 16 bits. From the microprocessor 601 point of view, latches 651 and 652 correspond to register EWRD, which is shown in FIG. 18. That is, microprocessor 601 can read both latches, 651 and 652, as one word through data bus DB29.

ROM 671 of read control circuit 620 typically stores 256 bytes of data and can be realized using a fuse type ROM, a low-capacity PROM, etc., as will be apparent to those skilled in the art Of course it may also be realized by using a portion of a larger-capacity ROM, or a RAM by transferring the data in advance of access. The lower 8 bits (AC1 to AC8) of the address line from address bus CAB are connected to address terminals A0 to A7 of ROM 671. ROM 671 output data terminals O0 to O7 are connected to inputs, 1D to 8D of first and second latches 651 and 652. ROM 671 terminals O0 to O7 are also connected to FIFO control circuit 623 through data bus lines Z0 to Z7 for FIFO control circuit 623.

The outputs of latches 651 and 652, D0 to D7 and D8 to D15, are connected to data bus DB29, which is read as register EWRD by microprocessor 601. A three-input AND gate 672 provides an output signal /EWROM which is input to both a chip select terminal CE and an output enable terminal OE of ROM 671. When either of the /EWWRH, /FIFOWR, or /EWWRL, signals input to AND gate 672 are at a low logic level, /EWROM is low, OE and CE are driven high, and ROM 671 outputs address data specified by the eight low end bits on address bus CAB.

The /EWWRH signal goes low when a higher end byte is selected for transfer by read control circuit 620 and /EWWRL goes low when a lower end byte is selected for transfer. The /FIFOWR signal goes low when data transfer is selected by FIFO control circuit 623. Since the /EWWRL and /EWWRH signals are input to clock terminals CK of latches 651 and 652, respectively, data is output from ROM 671 when these signals become active or low, and that data is retained in the latches. Furthermore, because the /EWWRL signal is also input to clock terminal C of flip-flop 674, output Q of flip-flop 674 is inverted to or drops low when lower end bytes are transferred. Output EWRDY is handled as bit d0 of status register 645, which has already been described, and bit d1 of transfer flag register 647. That is, it is treated as an EWRDY flag.

First and second latches 651 and 652 are treated as register EWRD by microprocessor 601. Therefore, microprocessor 601 carries out a read operation toward the EWRD register when attempting to read data stored in latches 651 and 652. At this time, the /EWRD signal becomes active low (0) and data retained first is output from latches 651 and 652, which are connected to the output enable pin. That is, data that was retained first by the latches is output on data bus DB29. Because the /EWRD signal is connected to preset terminal PR of flip-flop 674, at the same time that microprocessor 601 reads data from the latches, the logic level of the EWRDY signal, changes to high. That is, flag EWRDY, which is bit d0 of the status registers 645 and bit d1 of the transfer flag registers 647, is set to a logic level of one.

Assuming the above hardware configuration, control circuit 501 and microprocessor 601 transfer data from control circuit 501 to microprocessor 601 using the following procedures. The data to be transferred is the print data that control circuit 501 receives from work station 507, and the PDL program that is to be implemented by microprocessor 601. The data transfer accomplished by read control circuit 620, occurs using the data transfer routine illustrated in FIG. 24 and executed by CPU 510, and also using the data read interrupt processing routine shown in FIG. 26 and executed by microprocessor 601.

When print data has been prepared for transfer to cartridge 503, the processing routine shown in the flow chart of FIG. 24, commences. First, flag EWRDY (bit d0) of status register 645 is read in a step S700 and set to zero when data is transferred into latches 651 and 652. When that data is read by microprocessor 601, the EWRDY flag is set to one. Thus, a determination can be made as to whether or not flag EWRDY is set at one in a subsequent step S705.

A standby mode is adopted until flag EWRDY is set at a logical one level. When flag EWRDY is one, the next address, which is equal to the first address in the EWWRH area or portion of memory plus twice the amount (number of bytes) of data (D×2) to be transferred, is read in a step S710. When reading takes place for memory area EWWRH, data is read from ROM 671, and as shown in FIG. 25, the 256-byte data, is written sequentially at even number addresses within EWWRH, from 00h to FFh, in ROM 671.

The reason that no data is written to odd address values is because CPU 510 data access takes place in 1 word, or 16-bit, increments. Accessing words beginning with odd address numbers (an element of address bus errors) is not possible. When reading takes place for an address D×2 away from the first address in area EWWRH, data (D) is read from ROM 671 and latched in second latch 652, as shown in FIG. 23.

In this manner, when the transfer of higher end bytes of data, as retained by second latch 652, occurs, CPU 510 transfers the lower end bytes, or data retained by first latch 651, in a step S715. When one word of data has been retained in latches 651 and 652, CPU 510 sets one of the interrupt request registers (in this embodiment AMDINT0) in a step S720. CPU 510 continues execution of the transfer routine shown in FIG. 24. However, when the data retention takes place using first latch 651, flag EWRDY is set low (0), as indicated in FIG. 23. Therefore, transfer of the next data does not occur until flag EWRDY is set high (1) as in steps S700 and S705.

When CPU 510 sets an interrupt request register (AMDINT0), microprocessor 601 receives this interrupt request and starts a data read interrupt routine as shown in FIG. 26. This routine begins immediately after data is retained in latches 651 and 652 of read control circuit 620. Microprocessor 601 reads the one word of data prepared by control circuit 501 in step S730 by reading register EWRD. After that, microprocessor 601 transfers the data it read to specified areas of RAMs 611 through 614 (step S735).

Using the processing technique described above, electronic control circuit 501 is able to transfer data to cartridge 503, which is only connected to a read only data bus CDB. Moreover, since data writing takes place in byte sized units and reading takes place in word sized units, microprocessor 601 can more effectively receive data. The embodiment described above transferred data one word at a time as an example, but this is not a necessary limitation and data transfer may also take place in byte sized units. In this latter case, data transfer only uses memory storage area EWWRL and the upper eight (high end) bits of data may be discarded by microprocessor 601.

G. FIFO Control Circuit Configuration and Operation

FIFO control circuit 623 uses a latch 657 to temporarily store or latch data to be written to FIFO memory 621, and FIFO write and read registers 653 and 655, respectively, to control the writing and reading of data to FIFO memory 621. FIFO memory 621 typically stores 1,152 bytes of data and has internal write address and read counters. Internally, FIFO memory 621 has a write reset terminal, a read reset terminal, a write 8-bit data bus, a read 8-bit data bus, a write clock terminal, and a read clock terminal, all of which reset respective write and read counters.

In order to use FIFO memory 621 to transfer data from control circuit 501 to microprocessor 601, CPU 510 executes a transfer routine as illustrated in FIG. 27, which will be described first, and microprocessor 601 executes a processing routine illustrated in FIG. 28.

CPU 510 transfers several bytes of data using FIFO control circuit 623. When the data transfer routine shown in FIG. 27 is started by CPU 510, register FIFORST, which belongs to FIFO write circuit 654 of FIFO control circuit 623, is first read, and an address counter on the write side is also reset in a step S750. Next, a variable N is reset to zero in step S755 and subsequently used to count the number or quantity of data (data words) being transferred. After that, addresses (the first address of register FIFOWR plus data D×2) are read in a step S760. As with read control circuit 620, when these addresses are read, a specified address in ROM 671 is accessed (see FIG. 25) and data D, which CPU 510 is attempting to transfer, is output and latched using latch 657 through buses Z0 through Z7, which are shown in FIG. 22.

Next, register FIFOREQ of FIFO control circuit 623 is read, and data D, which is retained in latch 657, is processed for transfer to FIFO memory 621 in a step S765. When register FIFOREQ is read, a write clock is output to the write clock terminal of FIFO memory, 621. Data D, retained in latch 657, is written to addresses indicated by the write address counter of FIFO memory 621. At the same time, the contents of the write address counter inside of FIFO memory 621 are incremented by one. After one byte of data is written in this manner, variable N is incremented by one in a step S770, and a determination is made in a step S775 as to whether or not N is equal to a total number of bytes X of data that is to be transferred. As a consequence, steps S760 to S775, are repeated until the number of bytes N of transferred data equals the total number of bytes X of data to be transferred.

When the transfer of all of the data is complete, CPU 510 sets one of the interrupt request registers (AMDINT1) and notifies microprocessor 601 that data transfer is complete in a step S780. CPU 510 then proceeds through a NEXT step and the data transfer processing routine is terminated.

Microprocessor 601 receives interrupt request AMDINT1 and starts a data receive interrupt routine as represented by the flowchart of FIG. 28. When this routine begins, microprocessor 601 first reads register RDRST, which is part of FIFO read register 655 of FIFO control circuit 623. Microprocessor 601 then resets the address counter on the read side of FIFO memory 621 in a step S800. A variable M is then set at zero in a step 805 and subsequently used to count the number or amount of data received.

Register FIRCLK, which forms part of FIFO read register 655, is next read in a step S810 and data read to specified areas of RAMs 611 through 614 is transferred in a step S815. When register FIRCLK is read, a read clock signal is output to the clock terminal on the read side of FIFO memory 621, and the data D at the address indicated by the read address counter at that time are read out. At the same time, the contents of the address counter on the read side of FIFO memory 621 is incremented by one. Because a PDL program is usually what is being transferred through FIFO control circuit 623, the received data is transferred immediately to the specific area of RAM to be used for development of image data.

When one byte of data is received, variable M is incremented by one in a step S820, and whether or not the new value is equal to the total number of bytes X of data to be transferred is determined in a step S835. Thus, the processing described above in steps S810 to S825 is repeated until the number of bytes M of data received matches the total number of data X to be transferred.

When it is determined that data reception or transfer is completed, microprocessor 601 writes a command in polling command register 643 in a step S630, to indicate the end of the data reading process. By reading the contents of polling command register 643, CPU 510 knows that data reception has ended, and microprocessor 601 escapes to the RNT step and ends this processing routine.

A significant amount of data can be effectively transferred from control circuit 501 to microprocessor 601 using the processing technique described above. The transferred data is retained in specified areas of RAMs 611 through 614 of data transfer controller 603, where it awaits processing by microprocessor 601. When microprocessor 601 receives all of the print data from control circuit 501 that is to be developed (as a program using a PDL), it commences the PDL interpreter stored in ROMs 606 through 609 and processes this print data. Image development takes place using such processing and the results are stored as image data, also in specified areas of RAMs 611 through 614.

H. Double Bank Control Circuit Configuration and Operation

The image data provided as a result of image development is transferred to control circuit 501 and stored in a RAM 512 for printing by laser engine 505. This image data transfer takes place using double bank circuit 624, which is equipped with two banks that store 32 bytes (16 words) of data each. These banks are referred to as bank A and bank B, and generally have the same hardware construction. Therefore, only an example of the configuration of one bank, bank A, is shown in FIG. 29.

Each bank is configured to allow selective switching of its address and data buses between connection to microprocessor 601 and control circuit 501, which occurs for image data transfer. As indicated in FIG. 29, two data selectors 681 and 682 are used to select or redirect the address buses. Two sets of octal line buffers are used each set having two buffers, four octal line buffers 684 through 687 total, to select a (16-bit wide) data bus. Two RAMs 691 and 692, having a 32 byte memory capacity, gates 694 and 695, here being OR gates, and an inverter 696 complete one bank. In FIG. 29, two memory chips with a memory capacity of 32 bytes are used but a single memory chip could be used with appropriate switching of high end addresses.

Data selector 682 is configured to select and output the four least significant or low end bits (AC1 through AC4) from address bus CAB of control circuit 501, and the four low end bits (A2 through A5) from microprocessor 601. Address selection occurs using an ADDMUXA signal (register ADDMUXA bit d0), which is connected to a select terminal S. Data selector 682 switches the read and write signals of RAMs 691 and 692 to match a desired address bus selection, and switches whichever signal is connected to chip select terminals CE1 and CE2, and output enable terminal OE, using the ADDMUXA signal.

Octal line buffers 684 and 685 are typically configured as tri-state line buffers and are connected to data bus DB29.

When gate terminals 1G and 2G are set low (0), data bus DB29 of microprocessor 601 and is connected to the data buses of RAMs 691 and 692, and data can be written from microprocessor 601 to RAMs 691 and 692. A two-input OR gate 694 is connected to receive signals /DPWROA and /ADDMUXA as inputs, and has an output connected to both gate terminals 1G and 2G of buffers 684 and 685. The /DPWROA signal goes low (0) when microprocessor 601 attempts to write data to bank A. Therefore, to write data to bank A, if bit d0 of register ADDMUXA is set low in advance, the gates of line buffers 684 and 685 open and when microprocessor 601 outputs data to bus DB29, it is output to the data buses of RAMs 691 and 692 where it is stored.

When gate terminals 1G and 2G of line buffers 686 and 687 are set low (0), data bus DB68 is connected to the data buses of RAMs 691 and 692 and data is read from RAMs 691 and 692 to control circuit 501. A two-input OR gate 695 is connected to receive an inverted signal /DPOE1A from an inverter 696 and the ADDMUXA signal as its inputs, and has an output connected to both gate terminals 1G and 2G of line buffers 686 and 687. The /DPOE1A signal goes low (0) when control circuit 501 attempts to read data from bank A. Therefore, to read data from bank A, if bit d0 of register ADDMUXA is set high (1) in advance, the gates of line buffers 686 and 687 are open and data output to the data buses of RAMs 691 and 692 is output to data bus DB68 when the control circuit 501 performs a read operation.

The transfer of image data by microprocessor 601 and receipt by CPU 510 are now described assuming the above type of bank-memory hardware. A flowchart illustrating an exemplary transfer initiation routine for image data, which is executed by microprocessor 601, is shown in FIG. 30. As shown in FIG. 30, before image data is transferred, microprocessor 601 places a transfer start command in polling command register 643 in a step S850, and CPU 510 reads this command and executes the response processing routine illustrated in FIG. 31. That is, electronic control circuit 501 determines whether or not laser printer 500 is print enabled in a step S860. If laser printer 500 is enabled, one of the interrupt request registers (AMDINT2) is set, in a step S865, and operation proceeds to the step labeled NEXT which temporarily terminates the current routine. If, on the other hand, laser printer 500 is not enabled, microprocessor 601 is notified of this status in a step S870. If laser printer 500 is not print enabled, it means that the laser printer cannot print even if it receives the image data. For example, laser engine 505 might still not be warmed up or could have a paper jam.

When microprocessor 601 receives interrupt request signal AMDINT2 from control circuit 501, it starts the transfer interrupt routine shown in FIG. 31. When this processing starts, microprocessor 601 first writes a one to bit d0 of register ADDMUXA as in a step S900. When bit d0 of register ADDMUXA is one, as described using FIG. 29, the data buses of RAMs 691 and 692, which form bank A, are connected to data bus DB29 of microprocessor 601 and no access from control circuit 501 can take place.

Microprocessor 601 then transfers 16 words (here 32 bytes) of data to bank A DPWROA in a step S902. When data is written to bank A DPWROA, signal /DPWROA, which is shown in FIG. 29, goes low and data is written to RAMs 691 and 692 through line buffers 684 and 685. When this 16 word data transfer ends, microprocessor 601 writes a one to bit d0 of register ADDMUXA, in a step S904, and connects the data buses of RAMs 691 and 692 to data bus DB68 of control circuit 501.

After that, microprocessor 601 writes command data to bank A, in a step S906, to notify polling command register 643 that data transfer has ended, and data transfer for bank A terminates. Microprocessor 601 next executes the same processing described above for bank B, in a step S910. When data transfer for bank B terminates, in the same manner, microprocessor 601 writes additional command data to notify polling command register 643 that this transfer has ended. In this manner, a total of 32 words (or 64 bytes) of data are transferred from cartridge 503 to banks A and B.

CPU 510 executes the image data reception routine shown in FIG. 33 for the microprocessor 601 processing described above. That is, CPU 510 first reads bit d3 of status register 645 or flag CMDRD in a step S920 and determines whether or not it is set to zero in a step S925. When command data is to be written from microprocessor 601 to polling command register 643, flag CMDRD is set to zero. At this time, CPU 510 reads the command data in polling command register 643 in a step S930. The command data is then checked, in a step S935, to determine whether or not it indicates data transfers to bank A have ended, and if not, other processing (step S940) is executed. If the command data of polling command register 643 indicates an end to bank A data transfer, control circuit 501 reads the 16 words of bank A DPRAMA (see FIG. 17) in a step S945 and transfers the data to RAM 512 in a step S950. At this point, the reading of the 16-word data from bank A is terminated.

Control circuit 501, which permits the transfer of the next 16 words from microprocessor 601, then sets one of the interrupt request registers (AMDINT2), and the processing described above for steps S920 to S955 is executed for bank B. That is, when control circuit 501 determines from command data in polling command register 643 that data transfer from microprocessor 601 for bank B has ended, after reading the 16-word data of bank B DPRAMB and transferring it to RAM 512, it sets one of the interrupt request registers, requesting an interrupt from microprocessor 601.

Since microprocessor 601 repeats the interrupt processing routine shown in FIG. 32 when it receives such an interrupt request, the transfer of all data terminates when microprocessor 601 and CPU 510 have executed both routines (FIGS. 32 and 33). After the transfer of all of the image data, if new print data is not received from control circuit 501, microprocessor 601 writes a one in register CLKDIV of control register 650 after a predetermined amount of time and cuts its own operating frequency in half, here to 12.5 MHz, thereby reducing power consumption and generation of undesirable heat.

I. Image Data Printing

Control circuit 501, receives and then prints all of the image data by exchanging signals with laser engine 505 using double buffer 520 and a register 517. The exchange of signals between control circuit 501 and laser engine 505 is illustrated in graphic form in FIG. 34 and a general description of the printing process is provided below with reference to that figure.

When control circuit 501 receives developed image data from cartridge 503, it determines if laser engine 505 is ready to allow printing, that is, is the printer in a print-enabled mode. After any warm up period has ended and printing is enabled, the signals shown in FIG. 34 are output to laser engine 505 through register 517. Laser engine 505 receives these signals and immediately starts a paper or print medium transport motor. At the same time, rotation of the photosensitive drum begins, as does electrostatic charge processing, etc.

When paper, or other media, on which printing is to take place reaches a specified position relative to the photosensitive drum, laser engine 505 senses the leading edge of the paper and outputs a vertical margin control or VREQ signal to control circuit 501 through register 517. Upon receipt of the VREQ signal, control circuit 501 enters a standby mode for a pre-selected period of time. That is, it suspends or delays signal transmission to laser engine 505 for the length of time required for the photosensitive drum to rotate to a starting position for latent image formation, using a laser scanning beam.

A vertical synchronization or VSYNC signal is then output through register 517 to laser engine 505 which responds by outputting a laser beam horizontal synchronization or HSYNC signal through register 517. Because the VSYNC signal is the equivalent of an instruction to start reading one line of image data, laser engine 505 reads image data from one of RAMs 520A or 520B, of double bank buffer circuit 520, in synchronization with the VSYNC signal. To form blank or empty top or bottom margins on the image media, here paper, a controlled interruption or override to ignore the VSYNC signal occurs for the length of time required to scan the number of lines required to form the desired margin.

At the same time, CPU 510 counts signals and transfers required image data to RAM 520A or RAM 520B of double-buffer circuit 520. CPU 510 ends this transfer of image data to double buffer 520 when either a specified amount of time has elapsed after detection of a paper trailing edge, or a horizontal synchronization signal count reaches a preset value corresponding to the paper size. Using the above processing steps, one page of image data is transferred to laser engine 505 and then printed on paper.

III. Miscellaneous Aspects of the Invention

Embodiments of this invention were described above as being applied to printers. However, use of this invention is not limited to printers. The present invention can be applied to all types of equipment the uses an internal processor. For example, dedicated word processors, personal computers, work stations, electronic vehicle devices, facsimile machines, telephones, electronic memos, musical instruments, cameras, translation machines, hand copiers, cash dispensers, remote control devices and electronic calculators which utilize such processors, as well as cartridges of any other information processing device are some of the possible applications. In recent years, such computer related equipment has not only employed expansion slots, but often cartridge type expansion devices, such as IC cards.

In dedicated word processors and personal computers, equipped with expansion slots and IC card connectors, improving or adding to data processing functions or making operational modifications can be made easy. Such ease is achieved if the cartridge of this invention is installed in one of these devices and a monitor command, etc., is used to convert the operations of the original equipment processor to processing routines stored in the built in cartridge memory so that the original electronic equipment processor processes data along with the add-on control device. Moreover, if control is switched to a cartridge, no matter what the processing or process steps are, they can be modified. Therefore, it is possible to modify and improve the functionality of existing equipment as well as update software versions in a variety of dedicated equipment, such as dedicated word processors.

In this manner, this invention can be applied to all types of data processing equipment that use a processor to which an add-on cartridge or circuit can be connected, such as, for example, electronic automobile parts, facsimile machines, telephones, electronic memos, electronic musical instruments, electronic cameras, electronic translation machines, hand copiers, cash dispensers, remote control devices and electronic calculators. In such data processing equipment, if the processor on the equipment side is able to recognize the cartridge and easily switch its processing to an address provided for the cartridge, it is easy to use the cartridge and data processing device, even on existing electronic devices. If the equipment does not have such functions, a variety of means can be devised to switch the equipment side processor to the processing stored in the cartridge.

When a 68000 type microprocessor reads data from a specified address, the equipment or device (referred to as a slave) outputting the data determines whether or not data is on the data bus by using a data acknowledge signal, or DTACK for short. The DTACK signal provides a detectable response for the processor. For this reason, when the processor executes a jump instruction to an absolute address while executing processing routines stored in ROM on the equipment side, the cartridge analyzes and detects whether this was an execution of a jump instruction to an absolute address. The cartridge then outputs the execution address of the built in cartridge ROM to the data bus before the printer ROM outputs the absolute address of the jump destination to the data bus. The cartridge also returns a DTACK signal to the equipment-processor and forces processing to switch to a specified address in the cartridge. Once processing switches to the cartridge ROM, subsequent operations can be configured in a variety of manners.

This example assumes that the processor in the target electronic equipment executes a jump instruction to an absolute address. However, it is possible to use a configuration where the jump command itself is read from the equipment ROM. When power is applied and instructions initially read from ROM in the equipment, a code equivalent to a jump instruction from the cartridge is placed on the data bus, and signal DTACK is returned. While these methods raise the danger of a DTACK conflict, a detailed analysis of bus timing and appropriate design makes them possible to realize.

In addition, as shown in FIG. 35, slots or holes may be formed in printed circuit board 550 where compressible material 126 is located so that it presses directly against microprocessor 601. This configuration increases heat dissipation by also transferring heat directly through material 126. However, in some applications compressible material piece 126 may be omitted because printed circuit board 550 is itself manufactured from a substantially flexible material or plastic, and microprocessor 601 can be pushed or pressed upward using the elasticity of printed circuit board 550 itself with an appropriately physically biased mounting technique.

As indicated in FIG. 35, that portion of upper casing 100 making contact with microprocessor 601 is generally slightly raised (104). However, if the top surface of microprocessor 601 is made higher than the top of other circuit devices or components on the same side of printed circuit board 550, it is not necessary to raise area 104 to place the top of microprocessor 601 in contact with the casing. However, providing raised area 104 also allows accommodation of some unevenness in the inner surface of upper casing 100, which in turn advantageously allows upper casing 100 to be manufactured easily using die casting or hand processing techniques.

In the above embodiments, microprocessor 601 is mounted approximately along a center line and to the front of the cartridge along the direction in which the cartridge is inserted. However, if one or more other circuit elements within the cartridge generate more heat than microprocessor 601, they may be placed approximately centered and toward the front, connector end, of the cartridge. That is, it is generally better to place circuit elements or devices that generate the most heat centered in the front of the cartridge, regardless of their ultimate function. This allows the advantages of more efficient cooling through various conductive and convective dissipation techniques to be applied to the largest sources of heat in the cartridge to fully realize the potential of the inventive technique and apparatus.

This invention is not limited in any manner to the embodiments described above. It is possible to implement this invention in a variety of forms that do not deviate from the teachings of this invention. For example, the cartridge could have a built in outline font and receive data on the character point size from the printer and then generate a bit image at the designated point size and transfer it to the printer. The cartridge could be configured to store and display, without performing especially intricate processing, data received from the electronic device. The printer could also be of the ink-jet variety.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

APPENDIX A

NUMERICAL FIGURE DESIGNATIONS

| | |
|---|---|
| 1 | First main printer |
| 1A | Second main printer |
| 1B | Third main printer |
| 15 | Xerography unit |
| 27 | Ink supply |
| 100 | Upper case |
| 102 | Heat dissipation material |
| 104 | Spring |
| 106 | Expansion memory slot |
| 108 | Cartridge End |
| 110 | Metal plate |
| 120 | Lower case |
| 121 | Plate |
| 122 | Spring elements |
| 122a | First curved extension |
| 122b | Second curved extension |
| 124 | Mating wall |
| 125 | Screw hole |
| 126 | Biasing element |
| 128 | Biasing element retainer |
| 132 | Opening |
| 140 | Lower cap |
| 141 | Cap mounting tabs |
| 142 | Through-hole |
| 150 | Upper cap |
| 152 | Button lock |
| 154 | Button lock springs |
| 160 | Screws |
| 180 | First printer frame |
| 182 | Second printer frame |
| 200 | IC card |
| 210 | IC card connector |
| 500 | Printer |
| 501 | Electronic control circuit |
| 503 | Cartridge |
| 505 | Laser engine |
| 507 | Workstation |

APPENDIX A-continued

NUMERICAL FIGURE DESIGNATIONS

| | |
|---|---|
| 510 | CPU |
| 511 | ROM |
| 512 | RAM |
| 514 | Data input port |
| 515 | Line buffer |
| 516 | Bus line |
| 517 | Register |
| 518 | Console panel |
| 519 | Console panel I/F |
| 520 | Double-buffer circuit |
| 520A | RAM |
| 520B | RAM |
| 520C | Memory write controller |
| 520D | Memory read controller |
| 550 | Printed circuit board |
| 551 | Plug |
| 560 | First contact pad set |
| 562 | Second contact pad set |
| 564 | Third contact pad set |
| 566 | Fourth contact pad |
| 570 | Chain |
| 572 | Reinforced passage |
| 573 | Ring |
| 574 | Printer ground terminal |
| 580 | Keyed lock mechanism |
| 582 | Protruding element |
| 601 | Microprocessor |
| 601p | Microprocessor pins |
| 602 | Memory |
| 603 | Data transfer controller |
| 606 | ROM |
| 607 | ROM |
| 608 | ROM |
| 609 | ROM |
| 610 | Data selector |
| 611 | RAM |
| 612 | RAM |
| 613 | RAM |
| 614 | RAM |
| 615 | Expansion RAM interface |
| 617 | Tri-state buffer |
| 618 | ROM |
| 619 | Tri-state data buffer |
| 620 | Read control circuit |
| 621 | FIFO memory |
| 623 | FIFO control circuit |
| 624 | Double-buffer control circuit |
| 631 | First decoder |
| 632 | Second decoder |
| 635 | Bus controller |
| 637 | Reset terminal |
| 640 | Interrupt request register |
| 640a | First D-type flip-flop |
| 640b | Second D-type flip-flop |
| 640c | Third D-type flip-flop |
| 643 | Command register |
| 643a | First octal D-type flip-flop |
| 643b | Second octal D-type flip-flop |
| 643c | Fourth D-type flip-flop |
| 645 | Status register |
| 647 | Transfer flag register |
| 649 | PROM control register |
| 650 | Control register |
| 651 | First latch |
| 652 | Second latch |
| 653 | FIFO register |
| 654 | FIFO write circuit |
| 655 | FIFO read register |
| 657 | FIFO latch |
| 658 | First double bank buffer |
| 659 | Second double bank buffer |
| 661 | First oscillator |
| 663 | First oscillator |
| 665 | Second oscillator |
| 667 | Second oscillator |
| 670 | EEPROM |
| 671 | ROM |

APPENDIX A-continued

NUMERICAL FIGURE DESIGNATIONS

| | |
|---|---|
| 674 | Fifth D-type flip-flop |
| 680 | NAND gate |
| 681 | First data selector |
| 682 | Second data selector |
| 684 | First tri-state buffer |
| 685 | Second tri-state buffer |
| 686 | Third tri-state buffer |
| 687 | Fourth tri-state buffer |
| 691 | RAM |
| 692 | RAM |
| 694 | First OR gate |
| 695 | Second OR gate |
| 696 | Inverter |
| AAB | Microprocessor address bus |
| CAB | Connector address bus |
| CCC | Control signal |
| CDB | Data bus |
| CLK | Clock signal |
| CN10 | Printer connector |
| CN11 | Add-on connector |
| CSEL | Cartridge selector signals |
| DB29 | Data bus |
| DB68 | Data selector bus |
| EAB | Expansion address bus |
| IDB | ROM 606 to 609 data bus |
| RCLK | Real time clock signal |

What is claimed is:

1. An information processing device comprising:
a heat conductive element;
a processor in thermal communication with said heat conductive element, wherein said processor generates heat when energized, and wherein said beat conductive element dissipates heat generated by said processor;
a circuit board comprising a mounting area, wherein said processor is mounted at said mounting area; and
a compressible element,
wherein the circuit board is between the compressible element and the processor.

2. The information processing device of claim 1 wherein the information processing device is a cartridge.

3. The information processing device of claim 1 wherein the compressible element pushes the circuit board and the processor toward the heat conductive element.

4. The information processing device of claim 1 wherein the heat conductive element is a heat dissipation plate.

5. The information processing device of claim 1 wherein the heat conductive element comprises aluminum.

6. The information processing device of claim 1 wherein the compressible element comprises silicon rubber.

7. The information processing device of claim 1 further comprising an electrical contact at an edge region of the circuit board.

8. The information processing device of claim 1 wherein the circuit board is a printed circuit board.

9. The information processing device of claim 1 further comprising a ROM on the circuit board.

10. The information processing device of claim 1 further comprising a heat dissipating material between the heat conductive element and the processor, wherein the heat dissipating material directly contacts the processor and the beat conductive element.

11. The information processing device of claim 10 wherein the heat dissipating material is formed from a non-solid material.

12. The information processing device of claim 1 wherein the compressible element comprises an elastic material.

13. The information processing device of claim 1 further comprising a heat dissipating material between the heat conductive element and the processor, wherein the heat dissipating material comprises silicon rubber.

14. The information processing device of claim 1 wherein the processor is a microprocessor.

15. The information processing device of claim 1 further comprising a plurality of pins coupled to the processor, the pins being perpendicular to the orientation of the circuit board.

16. An information processing device comprising:
a heat conductive element;
a processor in thermal communication with said heat conductive element, wherein said processor generates heat when energized, and wherein said heat conductive element dissipates heat generated by said processor;
a circuit board comprising a mounting area, wherein said processor is mounted at said mounting area;
a heat dissipating material between the heat conductive element and the processor, wherein the heat dissipating material directly contacts the heat conductive element and the processor; and
an insertion plug including an electrical contact formed at an end region of the circuit board,
and wherein the information processing device further comprises a plurality of pins coupled to the circuit board, the plurality of pins oriented perpendicular to the orientation of the circuit board.

17. The information processing device of claim 16 wherein the heat conductive element is a plate.

18. The information processing device of claim 16 wherein the heat dissipating material has a heat conductance rate of 1 W/m·K or more.

19. The information processing device of claim 16 wherein the heat dissipating material is formed from a non-solid material.

20. The information processing device of claim 16 wherein the heat conductive element comprises aluminum.

21. The information processing device of claim 16 wherein the heat dissipating material comprises silicon rubber.

22. The information processing device of claim 16 wherein the information processing device is in the form of a cartridge.

23. The information processing device of claim 16 wherein the circuit board is a printed circuit board.

24. The information processing device of claim 16 further comprising a biasing element adapted to push the circuit board towards the heat conductive element.

25. The information processing device of claim 16 further comprising a housing configured to protect the processor.

26. The information processing device of claim 16 wherein the heat conductive element is in the form of a plate, and wherein the information processing device further comprises a ROM on the circuit board.

\* \* \* \* \*

UNITED STATES PATENT AND TRADEMARK OFFICE
CERTIFICATE OF CORRECTION

PATENT NO.   : 6,845,014 B2
DATED        : January 18, 2005
INVENTOR(S)  : Wakabayashi et al.

It is certified that error appears in the above-identified patent and that said Letters Patent is hereby corrected as shown below:

Column 37,
Lines 33 and 62, delete "beat", and insert -- heat --

Signed and Sealed this

Nineteenth Day of April, 2005

JON W. DUDAS
*Director of the United States Patent and Trademark Office*